(12) United States Patent
Peng et al.

(10) Patent No.: US 12,057,324 B2
(45) Date of Patent: Aug. 6, 2024

(54) SEMICONDUCTOR PACKAGE HAVING A SEMICONDUCTOR ELEMENT AND A WIRING STRUCTURE

(71) Applicants: Shanghai Tianma Micro-Electronics Co., Ltd., Shanghai (CN); Shanghai AVIC OPTO Electronics Co., Ltd., Shanghai (CN)

(72) Inventors: Xuhui Peng, Shanghai (CN); Kerui Xi, Shanghai (CN); Tingting Cui, Shanghai (CN); Feng Qin, Shanghai (CN); Jie Zhang, Shanghai (CN)

(73) Assignees: Shanghai Tianma Micro-Electronics Co., Ltd., Shanghai (CN); Shanghai AVIC OPTO Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/090,918

(22) Filed: Dec. 29, 2022

(65) Prior Publication Data

US 2023/0137800 A1     May 4, 2023

Related U.S. Application Data

(62) Division of application No. 16/913,020, filed on Jun. 26, 2020, now Pat. No. 11,581,196.

(30) Foreign Application Priority Data

May 11, 2020   (CN) .......................... 202010393854.6

(51) Int. Cl.
*H01L 21/48*     (2006.01)
*H01L 21/56*     (2006.01)
(Continued)

(52) U.S. Cl.
CPC ........ *H01L 21/4853* (2013.01); *H01L 21/486* (2013.01); *H01L 21/4896* (2013.01);
(Continued)

(58) Field of Classification Search
CPC ............... H01L 21/4853; H01L 21/486; H01L 23/49816; H01L 23/49822; H01L 23/3128;
(Continued)

(56) References Cited

U.S. PATENT DOCUMENTS 7,649,749 B2    1/2010  Tsukano et al.
8,552,570 B2 *  10/2013 Kikuchi ............... H05K 3/4682
                                                           257/784
(Continued)

FOREIGN PATENT DOCUMENTS

CN    104733379 A    6/2015
CN    107195594 A    9/2017
(Continued)

*Primary Examiner* — Khiem D Nguyen
(74) *Attorney, Agent, or Firm* — Anova Law Group, PLLC

(57)    ABSTRACT

A semiconductor package includes a semiconductor element, a wiring structure, an encapsulation structure, and a solder ball. The semiconductor element includes a plurality of pins. A side of the wiring structure is electrically connected to the plurality of pins of the semiconductor element. The wiring structure includes at least two first wiring layers. A first insulating layer is disposed between adjacent two first wiring layers of the at least two first wiring layers. The first insulating layer includes a plurality of first through-holes. The adjacent two first wiring layers are electrically connected to each other through the plurality of first through-holes. The encapsulation structure at least partially surrounds the semiconductor element. The solder ball is located on a side of the wiring structure away from the semicon-
(Continued)

ductor element. The solder ball is electrically connected to the at least two first wiring layers.

19 Claims, 19 Drawing Sheets

(51) Int. Cl.
*H01L 23/00* (2006.01)
*H01L 23/498* (2006.01)

(52) U.S. Cl.
CPC ...... *H01L 21/561* (2013.01); *H01L 23/49816* (2013.01); *H01L 23/49822* (2013.01); *H01L 24/81* (2013.01); *H01L 24/96* (2013.01); *H01L 24/97* (2013.01); *H01L 2924/37001* (2013.01)

(58) Field of Classification Search
CPC ... H01L 23/49838; H01L 24/81; H01L 24/96; H01L 24/97
See application file for complete search history.

(56) References Cited

U.S. PATENT DOCUMENTS

| | | | | |
|---|---|---|---|---|
| 8,581,388 | B2* | 11/2013 | Maeda | H01L 23/49811 438/622 |
| 10,811,328 | B1* | 10/2020 | Kang | H01L 23/055 |
| 2008/0012140 | A1* | 1/2008 | Tsukano | H05K 1/0271 257/E23.142 |
| 2010/0295191 | A1 | 11/2010 | Kikuchi et al. | |
| 2010/0301450 | A1 | 12/2010 | Lin et al. | |
| 2011/0042798 | A1 | 2/2011 | Pagaila et al. | |
| 2011/0241203 | A1* | 10/2011 | Nakasato | H05K 1/185 257/737 |
| 2011/0266652 | A1 | 11/2011 | Do et al. | |
| 2012/0049368 | A1* | 3/2012 | Tanaka | H01L 23/49822 257/774 |
| 2014/0102777 | A1 | 4/2014 | Chen et al. | |
| 2015/0371932 | A1* | 12/2015 | Hu | H01L 21/4825 438/123 |
| 2018/0005930 | A1* | 1/2018 | Chiu | H01L 21/4857 |
| 2018/0076142 | A1 | 3/2018 | Shim et al. | |
| 2019/0006308 | A1 | 1/2019 | Appelt et al. | |
| 2019/0035757 | A1* | 1/2019 | Yu | H01L 23/49811 |
| 2020/0211949 | A1 | 7/2020 | Strong et al. | |
| 2020/0295121 | A1* | 9/2020 | Liao | H01L 23/49838 |
| 2020/0312772 | A1 | 10/2020 | Xi et al. | |

FOREIGN PATENT DOCUMENTS

| | | |
|---|---|---|
| CN | 108231716 A | 6/2018 |
| CN | 108400119 A | 8/2018 |
| CN | 109390296 A | 2/2019 |

* cited by examiner

SEMICONDUCTOR PACKAGE HAVING A SEMICONDUCTOR ELEMENT AND A WIRING STRUCTURE

CROSS-REFERENCES TO RELATED APPLICATIONS

This application is a divisional of application Ser. No. 16/913,020, filed on Jun. 26, 2020, issued as U.S. Pat. No. 11,581,196 which claims the priority to Chinese patent application No. 202010393854.6, filed on May 11, 2020, the entirety of all of which is incorporated herein by reference.

FIELD

The present disclosure generally relates to the field of semiconductor packaging technology and, more particularly, relates to a semiconductor package and a formation method thereof.

BACKGROUND

With the development of advanced technologies such as artificial intelligence, 5G technology and smart phone, the requirement to semiconductor process keeps increasing, which drives and promotes the development of the semiconductor industry.

In the semiconductor technology, the semiconductor packaging technology has played an important role in the development of the semiconductor industry. Semiconductor packaging has been developed toward achieving a substantially small size, substantially light, substantially thin, a substantially large number of pins, substantially high reliability and substantially low cost. To meet the demand of advanced technologies, fan-out wafer-level packaging (FOWLP) technology has been employed in existing technology, but the cost of the wafer-level packaging technology is substantially high. The disclosed semiconductor package and method are directed to solve one or more problems set forth above and other problems.

SUMMARY

One aspect of the present disclosure provides a semiconductor package, including a semiconductor element, a wiring structure, an encapsulation structure, and a solder ball. The semiconductor element includes a plurality of pins. A side of the wiring structure is electrically connected to the plurality of pins of the semiconductor element. The wiring structure includes at least two first wiring layers. A first insulating layer is disposed between adjacent two first wiring layers of the at least two first wiring layers. The first insulating layer includes a plurality of first through-holes. The adjacent two first wiring layers are electrically connected to each other through the plurality of first through-holes. A diameter of one end of a first through-hole of the plurality of first through-holes close to the semiconductor element is greater than a diameter of another end of the first through-hole of the plurality of first through-holes away from the semiconductor element. The encapsulation structure at least partially surrounds the semiconductor element. The solder ball is located on a side of the wiring structure away from the semiconductor element. The solder ball is electrically connected to the at least two first wiring layers.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Figure 1:
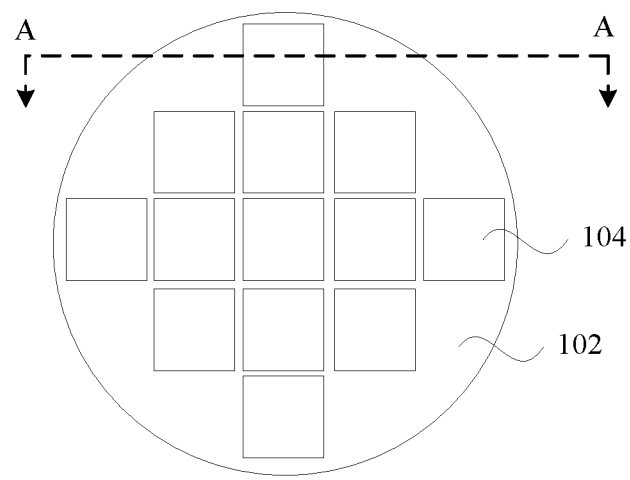
FIG. 1 illustrates a schematic top view of an existing wafer.
Figure 2:
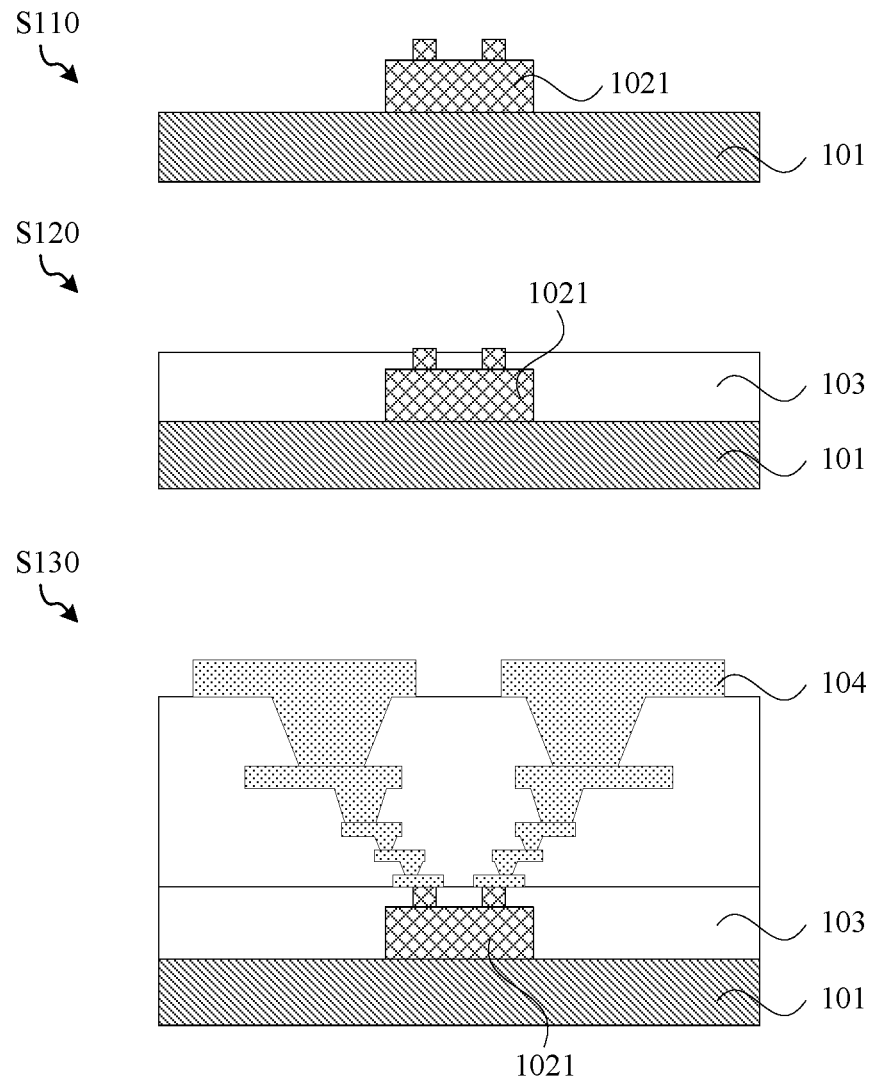
FIG. 2 illustrates schematic cross-sectional diagrams of semiconductor structures formed in various stages in an existing method of forming a semiconductor package.

An existing method of forming a semiconductor package is first described. FIG. 1 illustrates a schematic top view of an existing wafer; and FIG. 2 illustrates schematic cross-sectional diagrams of semiconductor structures formed in various stages in the existing method of forming a semiconductor package. The semiconductor structure of the semiconductor package formed in each stage in FIG. 2 is a cross-sectional structure along a cutting line A-A illustrated in FIG. 1. Referring to FIG. 1 and FIG. 2, the existing method of forming the semiconductor package includes following steps.

In S110: placing a wafer 102 on a substrate 101, and patterning the wafer 102 to form a plurality of semiconductor elements 1021.

In S120: forming a first encapsulation layer 103 to encapsulate the plurality of semiconductor elements 1021, and grinding the first encapsulation layer 103 to expose a pin of each semiconductor element 1021.

In S130: forming a plurality of wiring layers 104 having precision from high to low over the plurality of semiconductor elements 1021.

The existing method of forming the semiconductor package has a problem of high cost. The reason includes that in the existing technology, a wafer-level process is needed to directly and sequentially form the plurality of wiring layers 104 over the wafer 102. In a first aspect, the wafer 102 is used to form a circuit of the semiconductor element 1021. The wiring layer 104 is formed on the plurality of semiconductor elements 1021 using a copper plating process, etc. The size of the low-precision wiring layer 104 is larger than the size of the plurality of semiconductor elements 1021, which occupies a substantially large area of the wafer 102 and causes a substantially low utilization rate of the wafer 102. Further, the wafer often has a circular shape, and a substantially large package size reduces the utilization rate of the wafer. Therefore, the low-precision wiring layer 104 largely occupies the production capacity of the wafer-level process. In a second aspect, in the process of sequentially forming the plurality of wiring layers 104, cracks or distortion may occur, which causes a damage and waste of the entire wafer 102 located under the wiring layer 104, and a substantially low yield of the semiconductor package. Therefore, the existing method of forming the semiconductor package has a problem of high cost.

Figure 3:
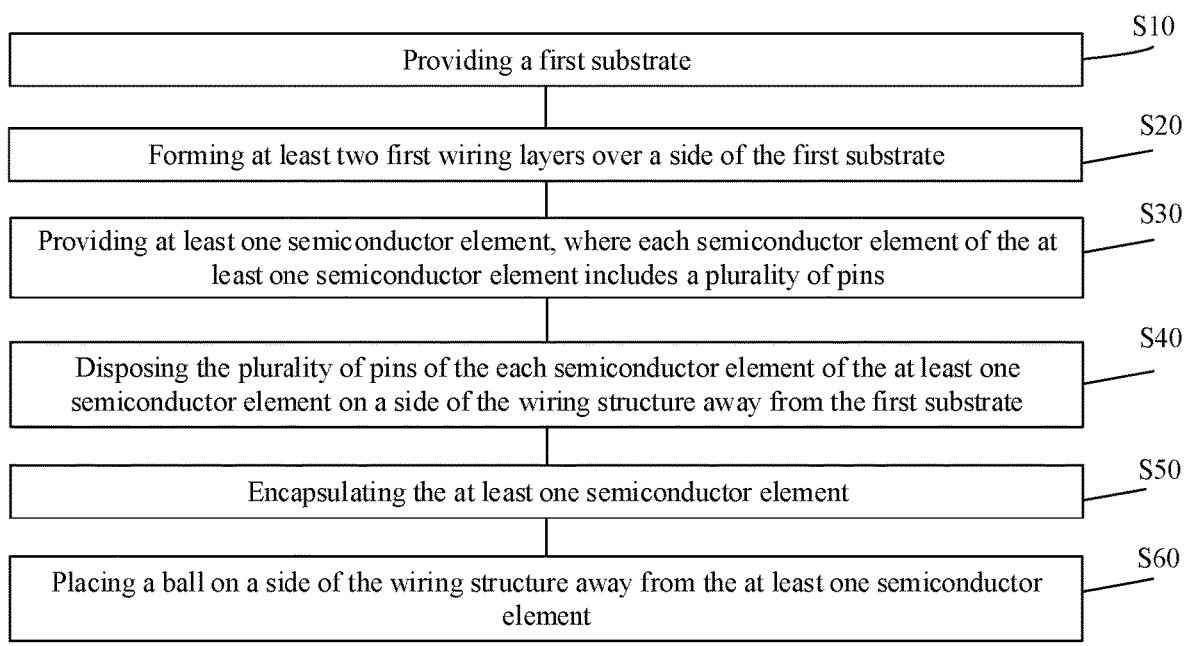
FIG. 3 illustrates a schematic flowchart of an exemplary method of forming a semiconductor package consistent with disclosed embodiments of the present disclosure.
Figure 4:
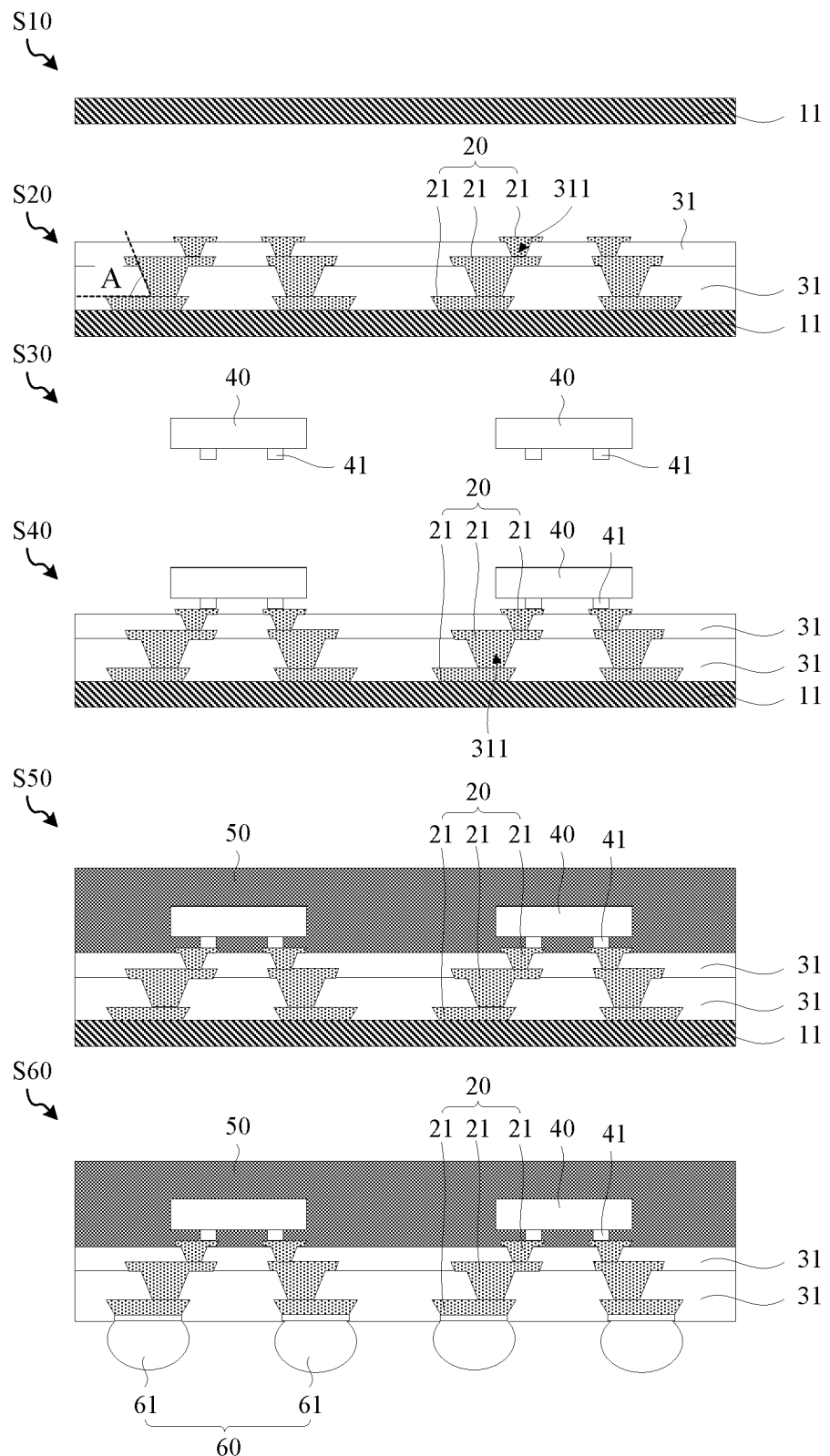
FIG. 4 illustrates schematic diagrams of semiconductor structures formed in various stages in an exemplary method of forming a semiconductor package consistent with disclosed embodiments of the present disclosure.

The present disclosure provides a method of forming a semiconductor package. The method may be applied to form a semiconductor package with a plurality of pins. FIG. 3 illustrates a schematic flowchart of a method of forming a semiconductor package consistent with disclosed embodiments of the present disclosure; and FIG. 4 illustrates schematic diagrams of semiconductor structures formed in various stages in the method of forming the semiconductor package. Referring to FIG. 3 and FIG. 4, the method of forming the semiconductor package may include following steps.

In S10: providing a first substrate 11. In one embodiment, the first substrate 11 may be made of a material including, e.g., at least one of glass and copper foil. The first substrate 11 may be suitable for use in a panel-level process. Compared with a substrate used in the wafer-level process, the size of the substrate used in the panel-level process may be larger, e.g., 300 mm×300 mm or larger. Therefore, the panel-level process may facilitate to achieve the fabrication of a substantially large amount of semiconductor packages on the basis of a substantially large substrate, and may facilitate the mass production of semiconductor packages. In one embodiment, the first substrate 11 may have a quadrilateral shape, which may be capable of packaging a substantially large amount of semiconductor elements. Thus, the utilization rate of the substrate for packaging may be substantially high, and the cost may be reduced.

In S20: forming at least two first wiring layers 21 on a side of the first substrate 11. A first insulating layer 31 may be disposed between adjacent two first wiring layers 21. The first insulating layer 31 may be patterned to form a plurality of first through-holes 311, and the adjacent two first wiring layers 21 may be electrically connected to each other through the plurality of first through holes 311. In one embodiment, the at least two first wiring layers 21 may constitute a wiring structure 20 of the semiconductor package. Optionally, a first wiring layer 21 closest to the first substrate 11 may be configured to have a largest line width and the lowest precision, and another first wiring layer 21 further away from the first substrate 11 may be configured to have smaller line width and higher precision. Such arrangement may facilitate to continuously dispose semiconductor elements on the first substrate 11.

Optionally, the first wiring layer 21 may be formed using a photolithography process and a copper plating process. Due to the characteristics of the photolithography process, the angle A between the outer surface of the formed first through-hole 311 and the first wiring layer 21 may be less than 90°. Along a direction away from the first substrate 11, when wiring layers have a from-low-to-high precision and have angle A of less than 90°, the wiring layers may be defined as negative wiring layers. The at least two first wiring layers 21 may be negative wiring layers. For illustrative purposes, the number of first wiring layers 21 illustrated in FIG. 4 may be three. The number of first wiring layers 21 may be two, four, five or more, which may be determined according to the size of the semiconductor package, the size and process precision of a semiconductor element 40 in practical applications.

Optionally, the minimum line width of the first wiring layer 21 may be greater than or equal to 5 μm, 4 μm, 3 μm, 2 μm, 1 μm, 0.5 μm, or any other size. In one embodiment, the existing panel-level process may reach a line width of 5 μm. Therefore, the first wiring layer 21 having a minimum line width of 5 μm may be formed using a panel-level process. Compared with the wafer-level process, the cost may be reduced.

In S30: providing at least one semiconductor element 40, where each semiconductor element 40 may include a plurality of pins 41. A semiconductor element 40 of the at least one semiconductor element may refer to a die made from a wafer using a wafer-level process. A pin 41 of the plurality of pins may be used for electrical connection with a wiring layer. For illustrative purposes, the number of pins 41 illustrated in FIG. 4 may be two. The number of pins 41 may also be 4, 5, 10, 16, 32 or more. It should be noted that the die may include a wafer substrate and a plurality of wiring layers wiring layers formed on the wafer substrate. Optionally, the plurality of pins of the die may be formed by patterning the wiring layer. The plurality of wiring layers included in the die may not be illustrated in FIG. 4.

In S40: disposing the plurality of pins 41 of the each semiconductor element 40 on a side of the wiring structure 20 away from the first substrate 11. A first wiring layer 21 closest to the semiconductor element 40 may have a smallest line width and highest precision, and another first wiring layer 21 further away from the semiconductor element 40 may have a larger line width and lower precision. Therefore, the size of the semiconductor element 40 may be smaller than the size of the first wiring layer 21. In other words, the size of the semiconductor element 40 may be smaller than the size of the semiconductor package. The first wiring layer 21 closest to the semiconductor element 40 may be electrically connected to the plurality of pins 41 of each semiconductor element 40. For illustrative purposes, the semiconductor element 40 may be electrically connected to the first wiring layer 21 using a binding process or a crimping process.

In S50: encapsulating the at least one semiconductor element 40. An encapsulation structure 50 may be formed by encapsulating the semiconductor element 40. The encapsulation structure 50 may be made of a material including epoxy resin molding compound (EMC). In one embodiment, the encapsulation structure 50 may be formed using an injection molding process. Optionally, the encapsulation structure 50 may be formed on a side of the wiring structure 20 away from the first substrate 11 and around the semiconductor element 40. In other words, the encapsulation structure 50 may cover the semiconductor element 40. The encapsulation structure 50 may protect the semiconductor element 40, and may provide a heat dissipation path for the semiconductor element 40.

In S60: placing balls on the side of the wiring structure 20 away from the at least one semiconductor element 40. A solder ball group 60 may be formed by placing balls on the side of the wiring structure 20 away from the semiconductor element 40. The solder ball group 60 may include a plurality of first solder balls 61, and a solder ball 61 of the plurality of first solder balls may be in contact with and electrically connected to the first wiring layer 21. The solder ball 61 of the plurality of first solder balls may be used to achieve electrical connection between the pin 41 of the semiconductor element 40 and an external circuit. The first solder ball 61 may be made of a metal material including tin, lead, copper, silver, gold, or an alloy thereof, etc.

For illustrative purposes, the solder ball group 60 may be formed using a printing process, a ball placement process, an electroplating process, a coating process, a sputtering process, etc. Before placing the balls, the first substrate 11 may need to be peeled off to expose the first wiring layer 21 with the lowest precision, such that the first solder ball may be electrically connected to the first wiring layer 21 with the lowest precision. The ball in the ball-placement process may be a metal ball or a metal block, for illustrative purposes, merely the metal ball may be illustrated in the Figure, which is not limited by the present disclosure.

Figure 5:
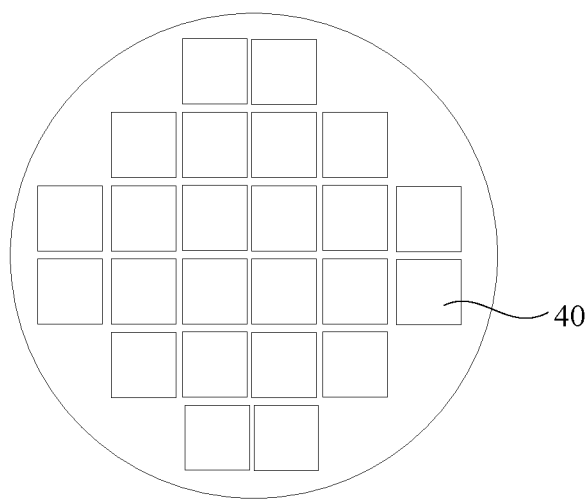
FIG. 5 illustrates a schematic diagram of an exemplary semiconductor element disposed on a wafer consistent with disclosed embodiments of the present disclosure.

FIG. 5 illustrates a schematic structural diagram of the semiconductor element disposed over the wafer consistent with disclosed embodiments of the present disclosure. Referring to FIG. 1 and FIG. 5, because the size of the semiconductor element 40 is smaller than the size of both the first wiring layer 21 and the semiconductor package, a substantially large amount of semiconductor elements 40 may be formed on the wafer. Compared with the existing technology, in the disclosed embodiments of the present disclosure, a plurality of wiring layers may not need to be formed on the wafer. In one embodiment, merely the semiconductor element 40 may be formed on the wafer, which may improve the utilization rate of the wafer.

The disclosed embodiments of the present disclosure may achieve at least following beneficial effects. In a first aspect, in the disclosed embodiments of the present disclosure, the semiconductor element 40 may be disposed on the already formed first wiring layer 21. In other words, the first wiring layer 21 may not need to be formed on the wafer, which may improve the utilization rate of the wafer, thereby reducing material cost.

In a second aspect, in the disclosed embodiments of the present disclosure, the semiconductor element 40 may be disposed on the already formed first wiring layer 21. Even if the first wiring layer 21 has a crack, poor contact, or abnormal short circuit issue during the manufacturing process, it may not cause damage and waste of the semiconductor element 40. Therefore, in the disclosed embodiments of the present disclosure, the manufacturing failure of the wiring layer may not cause the manufacturing failure of the entire wafer, thereby improving the yield of the semiconductor packages and reducing the cost.

In a third aspect, in the disclosed embodiments of the present disclosure, the semiconductor element 40 may be disposed on the already formed first wiring layer 21. Because offset and error exist in the process of manufacturing the first wiring layer 21, the semiconductor element 40 may be adjusted according to the offset and error of the first wiring layer 21, thereby improving the yield of semiconductor packages.

In a fourth aspect, in the disclosed embodiments of the present disclosure, the semiconductor element 40 may be formed using a wafer-level process, and then the fabrication of the first wiring layer 21 and electrical connection between the semiconductor element 40 and the first wiring layer 21 may be performed using a panel-level process. Compared with a wafer-level process, the panel-level process may achieve a fabrication on a substantially large substrate. Therefore, a substantially large amount of semiconductor packages may be simultaneously formed in one process, and mass production may be achieved, thereby facilitating to reduce manufacturing cost. Accordingly, the disclosed embodiments of the present disclosure may achieve low cost and high yield on the basis of achieving high precision.

Based on the foregoing embodiments, the disclosed embodiments of the present disclosure may further provide the refinement steps and supplementary steps of the foregoing steps.

For illustrative purposes, in the above embodiments, the wiring structure 20 may merely contain the first wiring layer 21, which may not be limited by the present disclosure. In certain embodiments, the wiring structure 20 may contain the first wiring layer 21 and any other suitable wiring layer.

Figure 6:
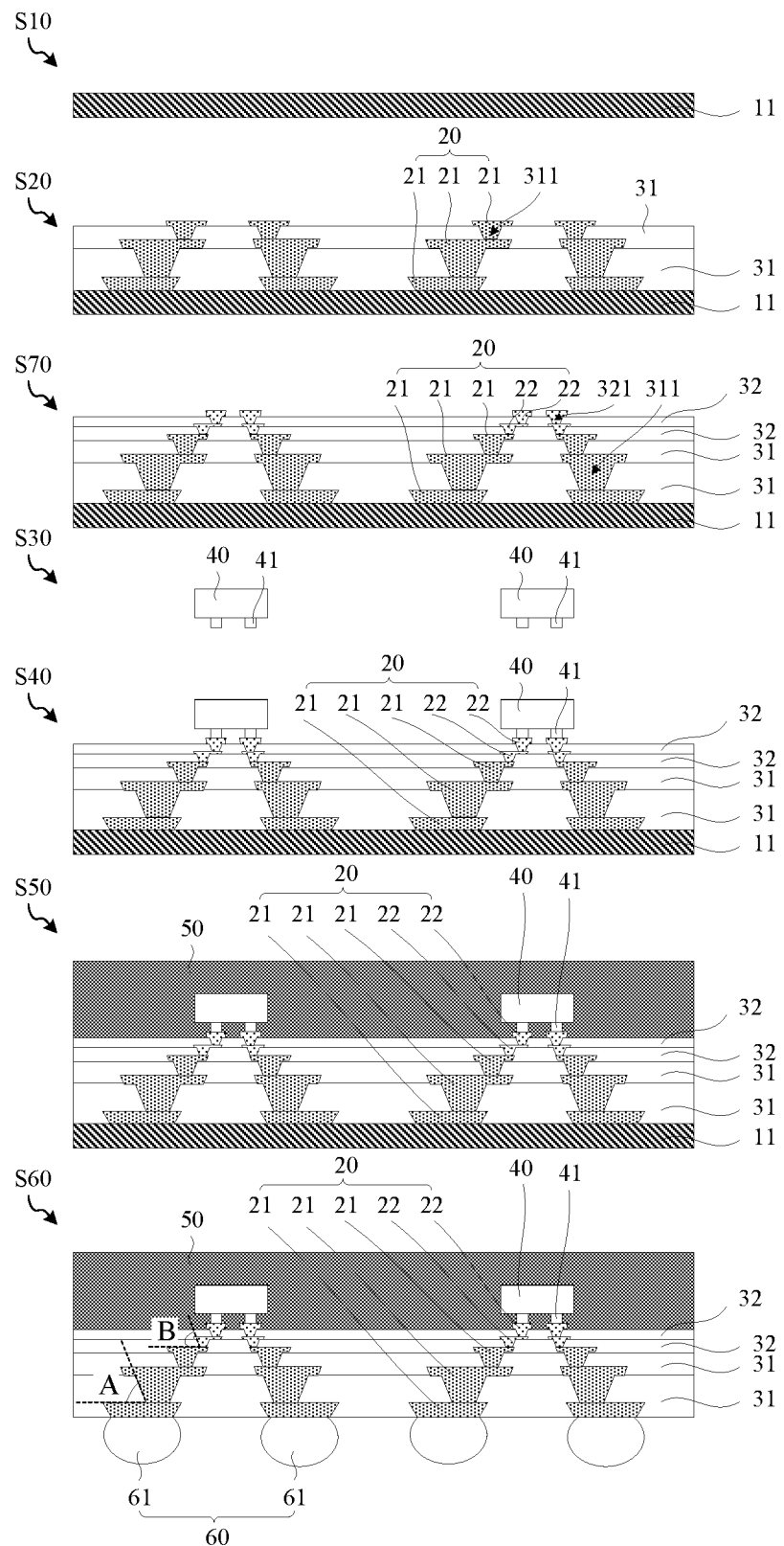
FIG. 6 illustrates schematic diagrams of semiconductor structures formed in various stages in another exemplary method of forming a semiconductor package consistent with disclosed embodiments of the present disclosure.

FIG. 6 illustrates schematic diagrams of semiconductor structures formed in various stages in another method of forming a semiconductor package consistent with disclosed embodiments of the present disclosure. In one embodiment, referring to FIG. 6, on the basis of the foregoing embodiments, the method of forming the semiconductor package may include following steps.

In S10: providing the first substrate 11.

In S20: forming at least two first wiring layers 21 on a side of the first substrate 11.

In S70: forming at least two second wiring layers 22 on a side of the first wiring layer 21 away from the first substrate 11. The second wiring layer 22 may be similar to the first wiring layer 21, and a second insulating layer 32 may be disposed between adjacent two second wiring layers 22. The second insulating layer 32 may be patterned to form a plurality of second through-holes 321, and the adjacent two second wiring layers 22 may be electrically connected to each other through the plurality of second through-holes 321. The wiring structure 20 of the semiconductor package may contain the at least two first wiring layers 21 and the at least two second wiring layers 22. For illustrative purposes, the number of second wiring layers 22 illustrated in FIG. 6 may be two. The number of second wiring layers 22 may be three, four, five or more, which may be determined according to the size of the semiconductor package, the size and process precision of the semiconductor element 40 in practical applications.

The difference between the second wiring layer 22 and the first wiring layer 21 may include that the minimum line width of the second wiring layer 22 is different from the minimum line width of the first wiring layer 21. In one embodiment, the minimum line width of the first wiring layer 21 may be greater than the minimum line width of the second wiring layer 22. In one embodiment, the second wiring layer 22 may be a high-precision wiring layer, and the minimum line width of the second wiring layer 22 may be, e.g., less than 5 μm, 4 μm, 3 μm, 2 μm, 1 μm, 0.5 μm or less. Correspondingly, the first wiring layer 21 may be a low-precision wiring layer, and the minimum line width of the first wiring layer 21 may be, e.g., greater than or equal to 5 μm, 4 μm, 3 μm, 2 μm, 1 μm, 0.5 μm, or any other suitable size.

In one embodiment, the existing panel-level process may reach a line width of 5 μm. Therefore, the first wiring layer 21 having a minimum line width of 5 μm may be formed using a panel-level process. Compared with the wafer-level process, the cost may be reduced. In one embodiment, the second wiring layer 22 may be formed using a wafer-level process to meet the requirements of high precision. The second wiring layer 22 may also be formed using a high-precision panel-level process, which may not be limited by the present disclosure.

In S30: providing at least one semiconductor element 40, where each semiconductor element 40 may include a plurality of pins 41.

In S40: disposing the plurality of pins 41 of the each semiconductor element 40 on a side of the wiring structure 20 away from the first substrate 11.

In S50: encapsulating the at least one semiconductor element 40.

In S60: placing balls on the side of the wiring structure 20 away from the at least one semiconductor element 40.

In the disclosed embodiments of the present disclosure, the second wiring layer 22 may be disposed in the wiring structure 20, and the precision of the second wiring layer 22 may be higher than the precision of the first wiring layer 21, which may facilitate to match the precision of the first wiring layer 21 with the precision of the semiconductor element 40. In addition, in the disclosed embodiments of the present disclosure, the first wiring layer 21 may be formed using a panel-level process, the second wiring layer 22 may be formed using a wafer-level process, and ultimately the second wiring layer 22 may be configured to be electrically connected to the semiconductor element 40. Therefore, the high precision of the wafer-level process and the low cost of panel-level process may be combined, and advantages of the wafer-level process and the panel-level process may be combined to achieve the fabrication of the semiconductor package, which may not only facilitate to improve the high precision of the semiconductor package, but also facilitate to reduce the cost of the semiconductor package.

In the above embodiments, the at least two second wiring layers 22 may be directly formed over the first wiring layer 21 in sequence, or the already formed second wiring layer 22 may be electrically connected to the first wiring layer 21. The specific fabrication method of the second wiring layer 22 may be described below, which may not be limited by the present disclosure.

Figure 7:
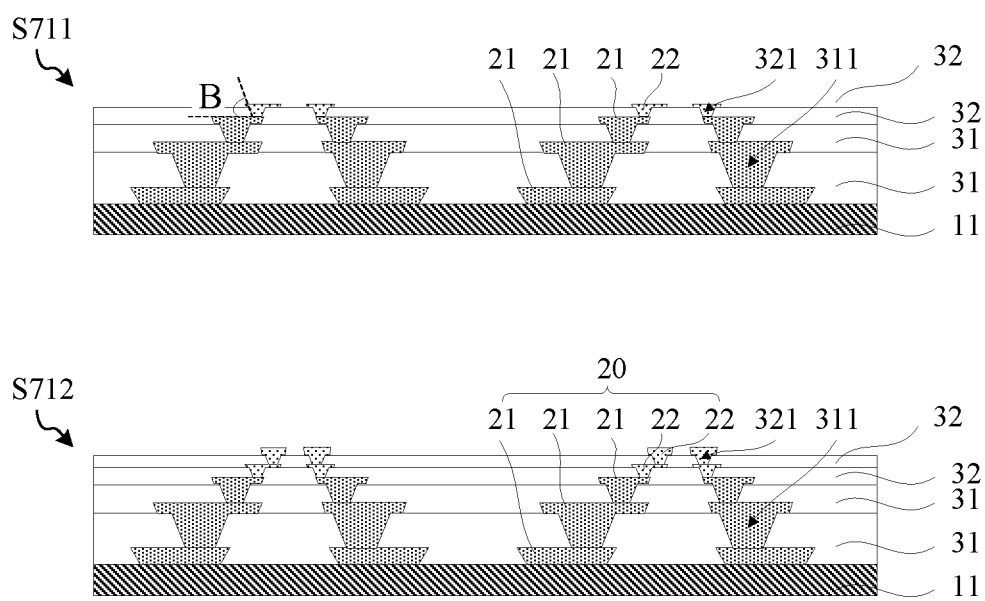
FIG. 7 illustrates schematic diagrams of semiconductor structures formed in various stages in an exemplary fabrication method of a second wiring layer consistent with disclosed embodiments of the present disclosure.

FIG. 7 illustrates schematic diagrams of semiconductor structures formed in various stages in a fabrication method of a second wiring layer consistent with disclosed embodiments of the present disclosure. Referring to FIG. 7, the fabrication method of the at least two second wiring layers 22 may include following steps.

In S711: forming a first layer of the at least two second wiring layers 22 on the side of the first wiring layer 21 away from the first substrate 11. The second wiring layer 22 may be made of, e.g., copper or gold. In one embodiment, the second wiring layer 22 may be formed using a high-precision panel-level process, and the second wiring layer 22 may be formed using a photolithography process and an electroplating process. In other words, the second insulating layer 32 may be first formed on the first wiring layer 21, and the plurality of second through-holes 321 may be formed by performing a photolithography process on the second insulating layer 32. The second wiring layer 22 may fill the plurality of second through-holes 321 and photoresist openings using an electroplating process, and then the photoresist layer may be removed. The second wiring layer 22 formed by the photolithography process and the electroplating process may have high precision, and may be suitable for high-precision patterning.

In another embodiment, the precision of the at least two second wiring layers 22 formed over the first wiring layer 21 may gradually increase to match the precision of the first wiring layer 21 and the semiconductor element 40. Optionally, the second wiring layer 22 may be formed using a panel-level process. The second wiring layer 22 may be formed using a photolithography process and a coating process. In other words, the second insulating layer 32 may be first formed on the first wiring layer 21, and the plurality of second through-holes 321 may be formed by performing a photolithography process on the second insulating layer 32. Then, the coating process may be performed, and the coated layer may be patterned to form the second wiring layer 22 filling the plurality of second through-holes 321. In this way, a seed layer may not need to be provided in advance by using the coating process, and the material of the coating process may be gold.

Referring to FIG. 6 and FIG. 7, due to the characteristics of the photolithography process, the angle A between the outer surface of the formed first through-hole 311 and the first wiring layer 21 may be less than 90°. Along a direction away from the first substrate 11, when wiring layers have a from-low-to-high precision and have angle A of less than 90°, the wiring layers may be defined as negative wiring layers. The at least two first wiring layers 21 may be negative wiring layers. Similarly, the angle B between the outer surface of the formed second through-hole 321 and the first wiring layer 21 may be less than 90°, then the second wiring layer 22 may be a negative wiring layer.

In S712: forming a second layer of the at least two second wiring layers 22 on a side of the first layer of the at least two second wiring layers 22 away from the first substrate 11. And so on, more second wiring layers 22 may be continuously formed. Such formed wiring structure 20 of the semiconductor package may be a structure containing a negative low-precision wiring layer and a negative high-precision wiring layer. In the disclosed embodiments of the present disclosure, the second wiring layer 22 may be formed using a high-precision panel-level process. In other words, both the first wiring layer 21 and the second wiring layer 22 may be formed using a panel-level process, thereby facilitating to further reduce the manufacturing cost of the semiconductor package.

Figure 8:
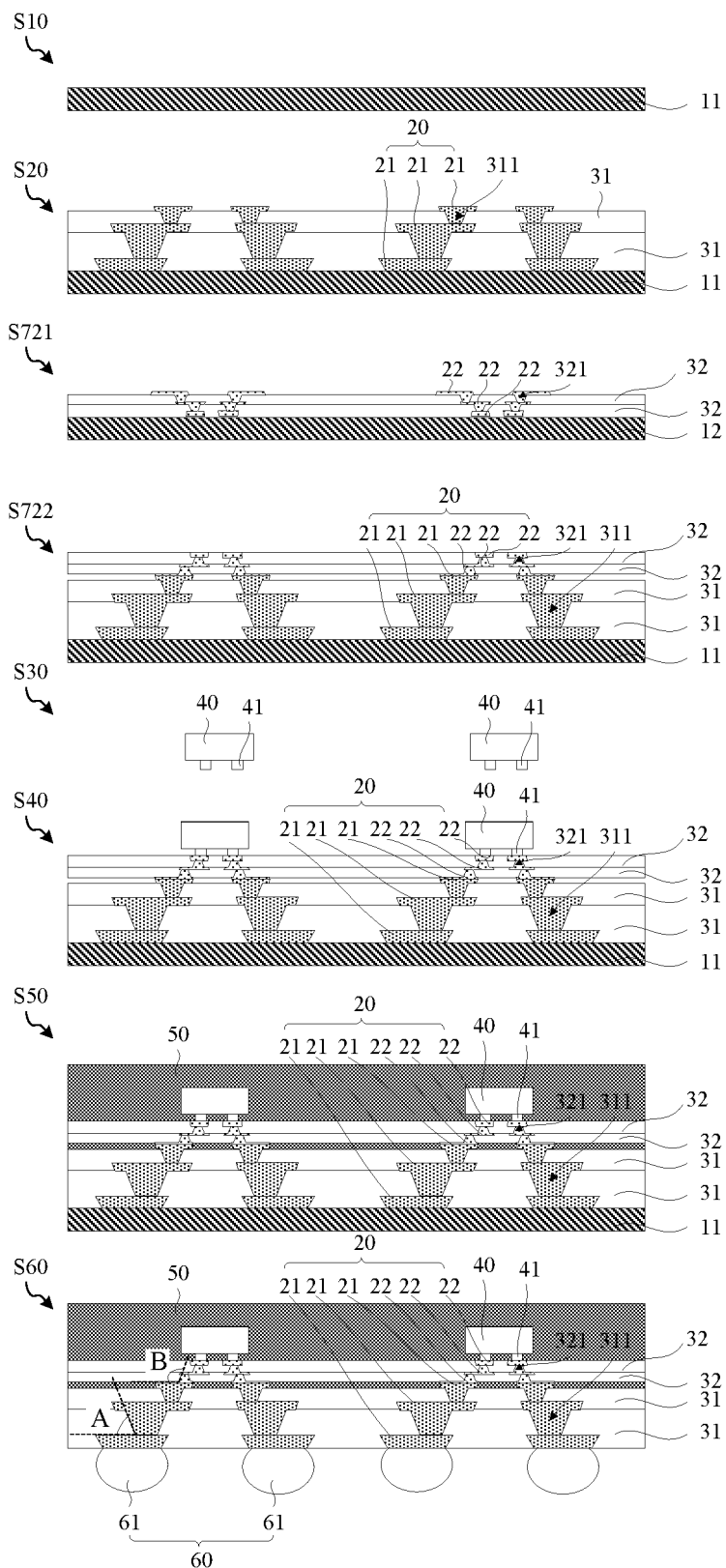
FIG. 8 illustrates schematic diagrams of semiconductor structures formed in various stages in another exemplary method of forming a semiconductor package consistent with disclosed embodiments of the present disclosure.

FIG. 8 illustrates schematic diagrams of semiconductor structures formed in various stages in another method of forming a semiconductor package consistent with disclosed embodiments of the present disclosure. Referring to FIG. 8, the method of forming the semiconductor package may include following steps.

In S10: providing the first substrate 11.

In S20: forming at least two first wiring layers 21 on a side of the first substrate 11.

In S721: providing a second substrate 12, and forming at least two second wiring layers 22 on a side of the second substrate 12. The second substrate 12 may be made of, e.g., glass, and the second wiring layer 22 may be made of, e.g., copper or gold. In one embodiment, the second wiring layer 22 may be formed using a wafer-level process, and the second wiring layer 22 may be formed using a photolithography process and an electroplating process. Optionally, the precision of the at least two second wiring layers 22 formed over the second substrate 12 may be from high to low along a direction away from the second substrate, to match the precision of the first wiring layer 21 and the semiconductor element 40 in subsequent process steps.

In S722: disposing a side of the at least two second wiring layers 22 away from the second substrate 12 on the side of the at least two first wiring layers 21 away from the first substrate 11, and peeling off the second substrate 12. Both the first wiring layer 21 and the second wiring layer 22 may be made of metal. In one embodiment, the first wiring layer 21 may be made of copper or gold, and the second wiring layer 22 may be made of copper or gold. The first wiring layer 21 may be electrically connected to the second wiring layer 22 using a metal bonding process, e.g., a pressing process or a binding process.

In S30: providing at least one semiconductor element 40, where each semiconductor element 40 may include a plurality of pins 41.

In S40: disposing the plurality of pins 41 of the each semiconductor element 40 on a side of the wiring structure 20 away from the first substrate 11.

In S50: encapsulating the at least one semiconductor element 40.

In S60: placing balls on the side of the wiring structure 20 away from the at least one semiconductor element 40.

In the disclosed embodiments of the present disclosure, due to the characteristics of the photolithography process, the angle A between the outer surface of the formed first through-hole 311 and the first wiring layer 21 may be less than 90°. Along a direction away from the first substrate 11, when wiring layers have a from-low-to-high precision and have angle A of less than 90°, the wiring layers may be defined as negative wiring layers. The at least two first wiring layers 21 may be negative wiring layers. Similarly, because the second wiring layer 22 formed on the second substrate 12 is turned over in S722, the angle B between the outer surface of the formed second through-hole 321 over the first wiring layer 21 and the first wiring layer 21 may be greater than 90°, then the second wiring layer 22 may be a positive wiring layer. Such formed wiring structure 20 of the semiconductor package may be a structure containing a negative low-precision wiring layer and a positive high-precision wiring layer.

In the disclosed embodiments of the present disclosure, the second wiring layer 22 may be disposed in the wiring structure 20. The precision of the second wiring layer 22 may be greater than the precision of the first wiring layer 21, which may facilitate to match the precision of the first wiring layer 21 and the precision of the semiconductor element 40. In addition, in the disclosed embodiments of the present disclosure, the first wiring layer 21 may be formed using a panel-level process, and the second wiring layer 22 may be formed using a wafer-level process, and ultimately the second wiring layer 22 may be configured to be electrically connected to the semiconductor element 40. Therefore, the high precision of the wafer-level process and the low cost of panel-level process may be combined, and advantages of the wafer-level process and the panel-level process may be combined to achieve the fabrication of the semiconductor package, which may not only facilitate to improve the high precision of the semiconductor package, but also facilitate to reduce the cost of the semiconductor package.

Figure 9:
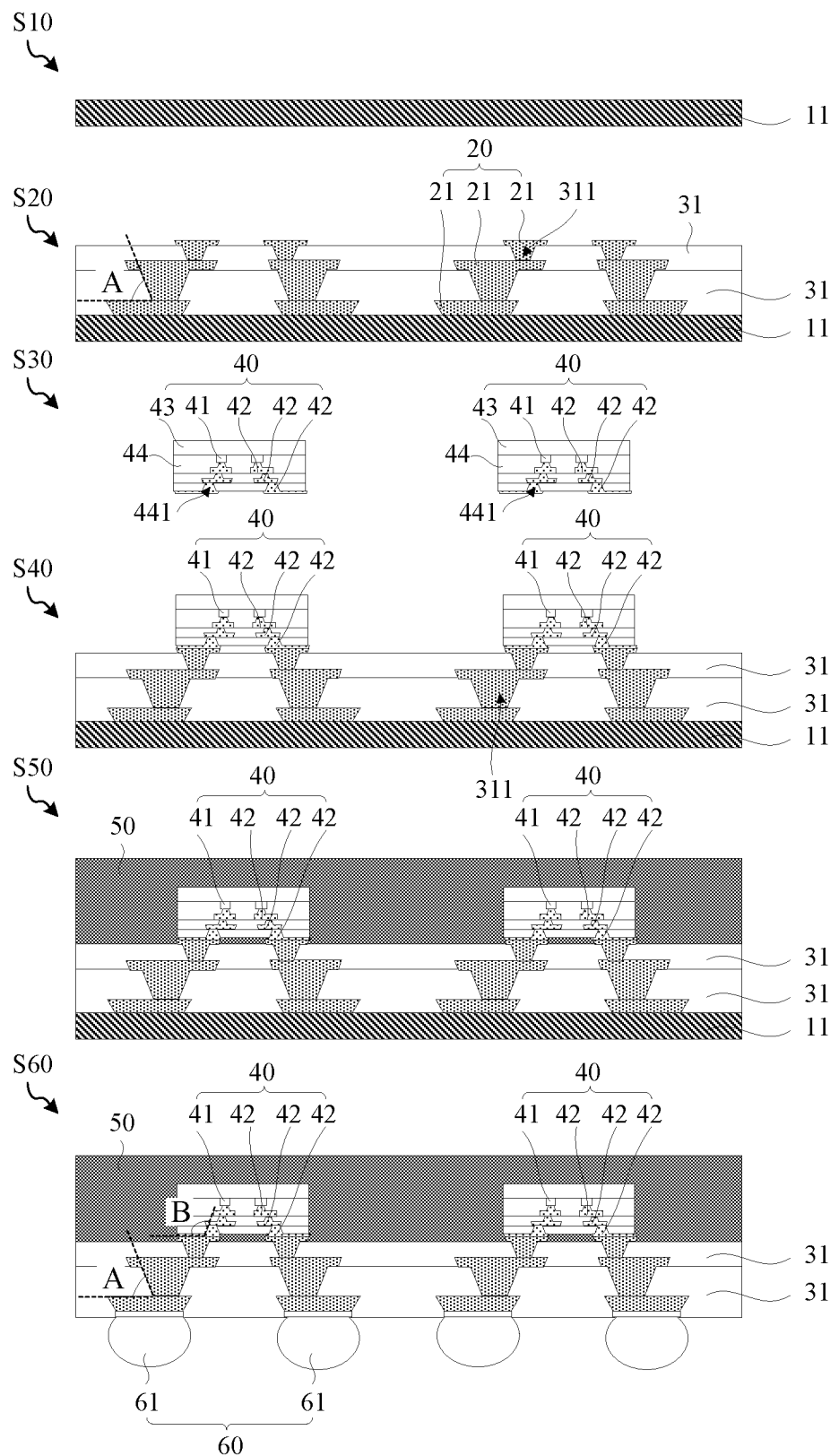
FIG. 9 illustrates schematic diagrams of semiconductor structures formed in various stages in another exemplary method of forming a semiconductor package consistent with disclosed embodiments of the present disclosure.

FIG. 9 illustrates schematic diagrams of semiconductor structures formed in various stages in another method of forming a semiconductor package consistent with disclosed embodiments of the present disclosure. In one embodiment, referring to FIG. 9, on the basis of the foregoing embodiments, the method of forming the semiconductor package may include following steps.

In S10: providing the first substrate 11.

In S20: forming at least two first wiring layers 21 on a side of the first substrate 11.

In S30: providing at least one semiconductor element 40, where each semiconductor element 40 may include a plurality of pins 41. The semiconductor element 40 may further include a die 43 and at least two third wiring layers 42. The third wiring layer 42 may be located on a side of the die 43, and a third wiring layer 42 farthest away from the die 43 may be configured as the pins 41 of the semiconductor element

40. A third insulating layer 44 may be disposed between adjacent two third wiring layers 42. The third insulating layer 44 may be patterned to form a plurality of third through-holes 441, and adjacent two third wiring layers 42 may be electrically connected to each other through the plurality of third through-holes 441.

In one embodiment, a fabrication method of the semiconductor element 40 may include: patterning the wafer using a wafer-level process to form a die pattern; continuously forming at least two third wiring layers 42 on the wafer using the wafer-level process. The precision of the at least two third wiring layers 42 may gradually decrease (the line width may gradually increase) along a direction away from the die until the precision (line width) of a third wiring layer 42 matches the precision (line width) of a first wiring layer 21 farthest away from the first substrate 11. In one embodiment, the minimum line width of the panel-level process may be 5 μm (or 3 μm), and accordingly, the maximum line width of the third wiring layer 42 may be configured to be 5 μm (or 3 μm).

In S40: disposing the plurality of pins 41 of the each semiconductor element 40 on a side of the wiring structure 20 away from the first substrate 11.

In S50: encapsulating the at least one semiconductor element 40.

In S60: placing balls on the side of the wiring structure 20 away from the at least one semiconductor element 40.

In the disclosed embodiments of the present disclosure, due to the characteristics of the photolithography process, the angle A between the outer surface of the formed first through-hole 311 and the first wiring layer 21 may be less than 90°. Along a direction away from the first substrate 11, when wiring layers have a from-low-to-high precision and have angle A of less than 90°, the wiring layers may be defined as negative wiring layers. The at least two first wiring layers 21 may be negative wiring layers. Similarly, because the semiconductor element 40 provided in S30 includes the third wiring layer 42 directly formed on the die 43, the angle B between the outer surface of the formed third through-hole 441 and the first wiring layer 21 may be greater than 90°, then the third wiring layer 42 may be a positive wiring layer. Such formed wiring structure 20 of the semiconductor package may be a structure containing a negative low-precision wiring layer and the semiconductor element (a positive high-precision wiring layer).

In the disclosed embodiments of the present disclosure, the third wiring layer 42 having the precision matched with the first wiring layer 21 may be disposed in the semiconductor element 40. The first wiring layer 21 may be formed under a panel-level process, the semiconductor element 40 may be formed under a wafer-level process, and ultimately the first wiring layer 21 may be configured to be electrically connected to the semiconductor element 40. Therefore, the high precision of wafer-level process and the low cost of panel-level process may be combined, and advantages of the wafer-level process and the panel-level process may be combined to achieve the fabrication of the semiconductor package, which may not only facilitate to improve the high precision of the semiconductor package, but also facilitate to reduce the cost of the semiconductor package.

Figure 10:
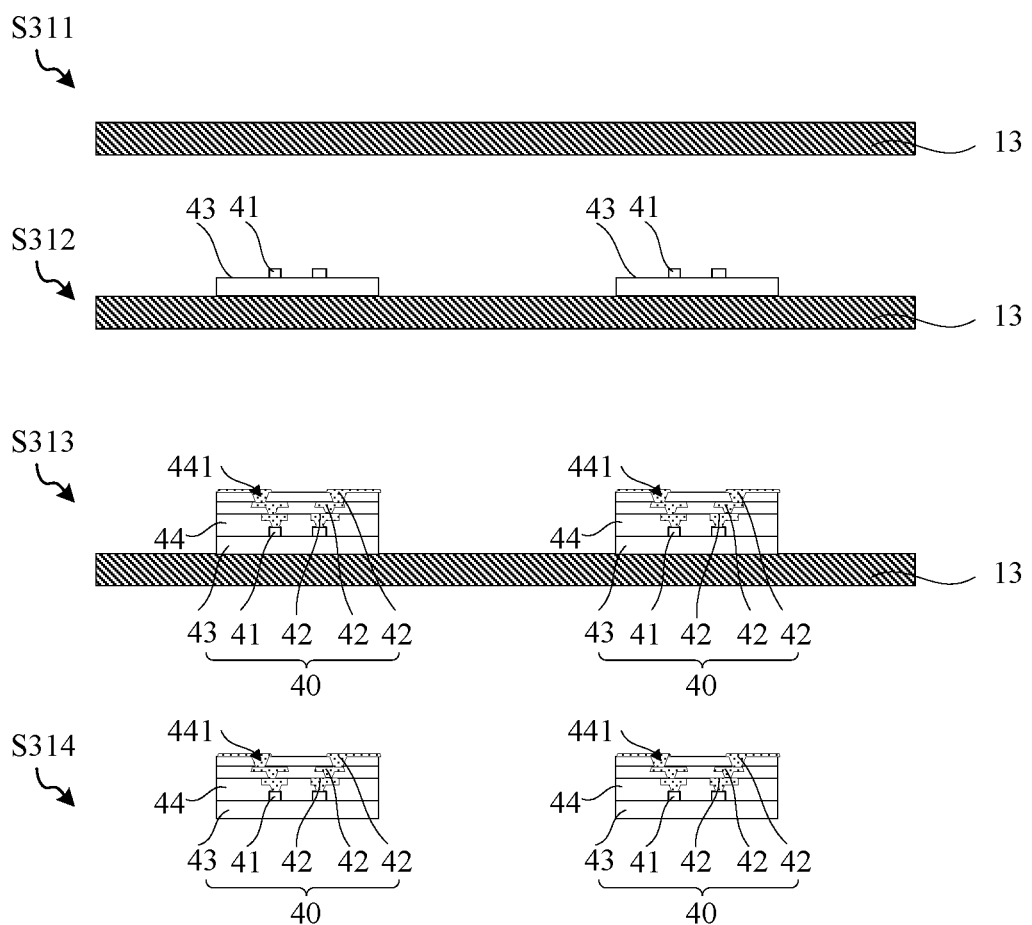
FIG. 10 illustrates schematic diagrams of semiconductor structures formed in various stages in an exemplary fabrication method of a semiconductor element consistent with disclosed embodiments of the present disclosure.

In the above-disclosed embodiments, for illustrative purposes, the third wiring layer 42 may be directly formed on the die 43, which may not be limited by the present disclosure. In certain embodiments, the die 43 and the third wiring layer 42 may be separately formed. FIG. 10 illustrates schematic diagrams of semiconductor structures formed in various stages in a fabrication method of a semiconductor element consistent with disclosed embodiments of the present disclosure. Referring to FIG. 10, on the basis of the forgoing embodiments, the fabrication method of the semiconductor element may include following steps.

In S311: providing a third substrate 13. The third substrate 13 may be made of, e.g., glass. Compared with the first substrate 11, the size of the third substrate 13 may be smaller to meet the requirements of the wafer-level process.

In S312: providing a plurality of dies 43, and disposing the plurality of dies 43 on a side of the third substrate 13. Each die 43 may include a plurality of pins 41.

In S313: forming the at least two third wiring layers 42 in sequence on a side of the plurality of dies 43 away from the third substrate 13. The third wiring layer 42 may be made of, e.g., copper or gold. In one embodiment, the at least two third wiring layers 42 may be sequentially formed on the plurality of dies 43 using a wafer-level process. Along a direction away from the semiconductor element 40, the precision of the at least two third wiring layers 42 may gradually decrease (the line width thereof may gradually increase) until the precision (line width) of a third wiring layer 42 matches the precision (line width) of a first wiring layer 21 farthest away from the first substrate. In one embodiment, the minimum line width of the panel-level process may be 5 μm (or 3 μm), and accordingly, the maximum line width of the third wiring layer 42 may be configured to be 5 μm (or 3 μm).

In S314: forming the semiconductor element 40 by cutting. In one embodiment, after forming the semiconductor element 40 by cutting, the third substrate 13 may be directly peeled off, and such formed semiconductor element 40 may not include the third substrate 13 (as illustrated in FIG. 10). In another embodiment, after forming the semiconductor element 40 by cutting, the third substrate 13 may be retained, and such formed semiconductor element 40 may include the third substrate 13. After disposing the semiconductor element 40 on the first wiring layer 21, the third substrate 13 may be peeled off. In one embodiment, forming the semiconductor element 40 by cutting may refer to that cutting the third insulating layer 44 between adjacent two dies 43 to form the plurality of individual semiconductor elements 40.

In the disclosed embodiments of the present disclosure, the third wiring layer 42 having the precision matched with the first wiring layer 21 may be disposed in the semiconductor element 40. The first wiring layer 21 may be formed under a panel-level process, the semiconductor element 40 may be formed under a wafer-level process, and ultimately the first wiring layer 21 may be configured to be electrically connected to the semiconductor element 40. Therefore, the high precision of wafer-level process and the low cost of panel-level process may be combined, and advantages of the wafer-level process and the panel-level process may be combined to achieve the fabrication of the semiconductor package, which may not only facilitate to improve the high precision of the semiconductor package, but also facilitate to reduce the cost of the semiconductor package.

On the basis of the above-disclosed embodiments, optionally, encapsulating the semiconductor element 40 may include many forms, and some may be described below, which is not limited by the present disclosure.

Figure 11:
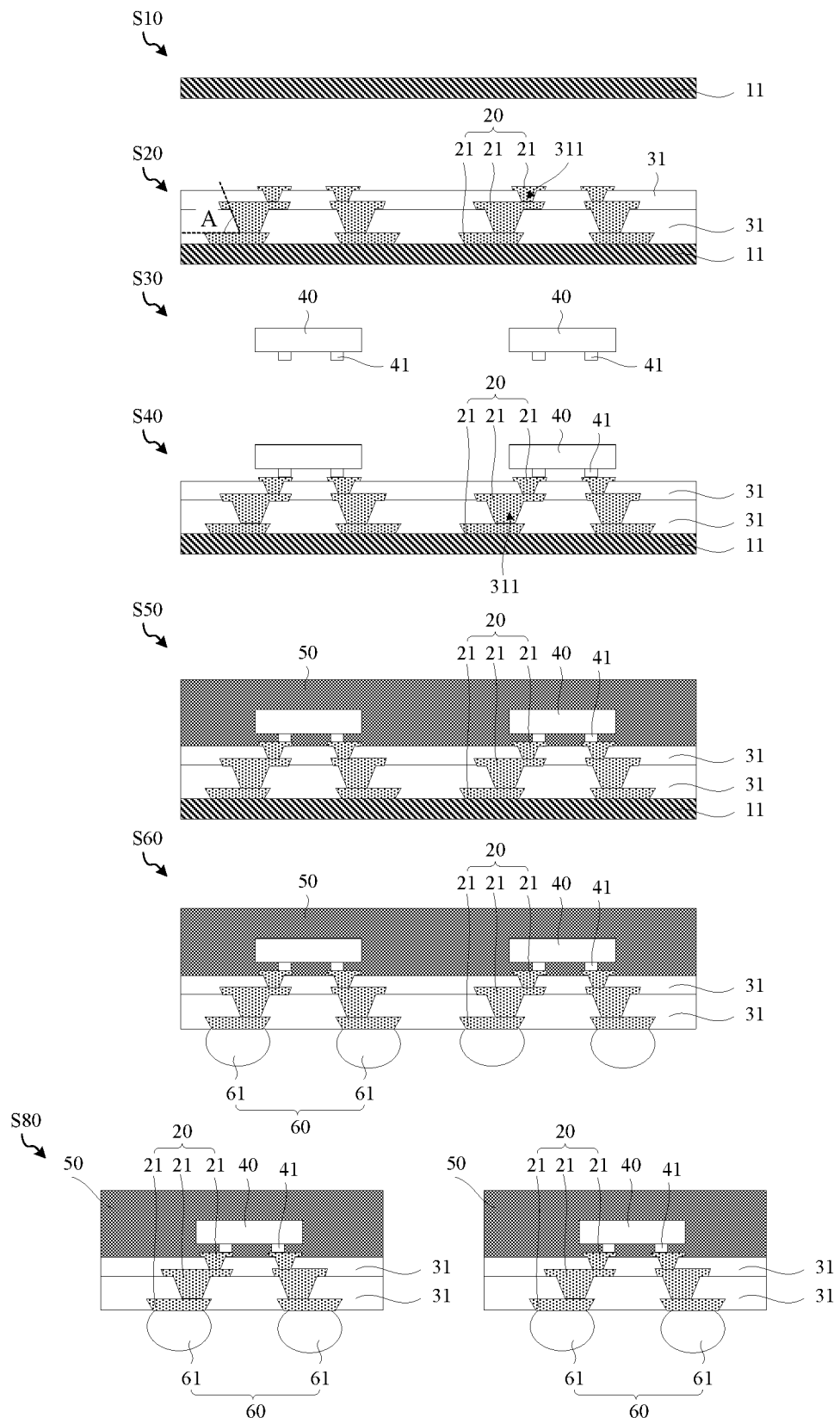
FIG. 11 illustrates schematic diagrams of semiconductor structures formed in various stages in another exemplary method of forming a semiconductor package consistent with disclosed embodiments of the present disclosure.

FIG. 11 illustrates schematic diagrams of semiconductor structures formed in various stages in another method of forming a semiconductor package consistent with disclosed embodiments of the present disclosure. In one embodiment, referring to FIG. 11, the method of forming the semiconductor package may include following steps.

In S10: providing the first substrate 11.

In S20: forming at least two first wiring layers 21 on a side of the first substrate 11.

In S30: providing a plurality of semiconductor elements 40, where each semiconductor element 40 may include a plurality of pins 41.

In S40: disposing the plurality of pins 41 of the each semiconductor element 40 on a side of the wiring structure 20 away from the first substrate 11.

In S50: forming an encapsulation structure 50 to encapsulate the at least one semiconductor element 40.

In S60: placing balls on the side of the wiring structure 20 away from the at least one semiconductor element 40.

In S80: cutting the first wiring layer 21 and the encapsulation structure 50 to form a plurality of semiconductor packages.

The edge of the encapsulation structure 50 of the semiconductor package formed in S50 may be flush with the edge of the first wiring layer 21. In addition, the semiconductor element 40 may be first encapsulated and then may be cut, the encapsulation structure 50 may be configured to support the semiconductor element, which may facilitate to maintain the rigidity of the semiconductor package during the cutting process, and may facilitate the cutting process.

It should be noted that for illustrative purposes, FIG. 11 illustrates that the encapsulating process may be first performed and then the cutting process may be performed, which may not be limited by the present disclosure. In certain embodiments, the cutting process may be first performed and then the encapsulating process may be performed.

Figure 12:
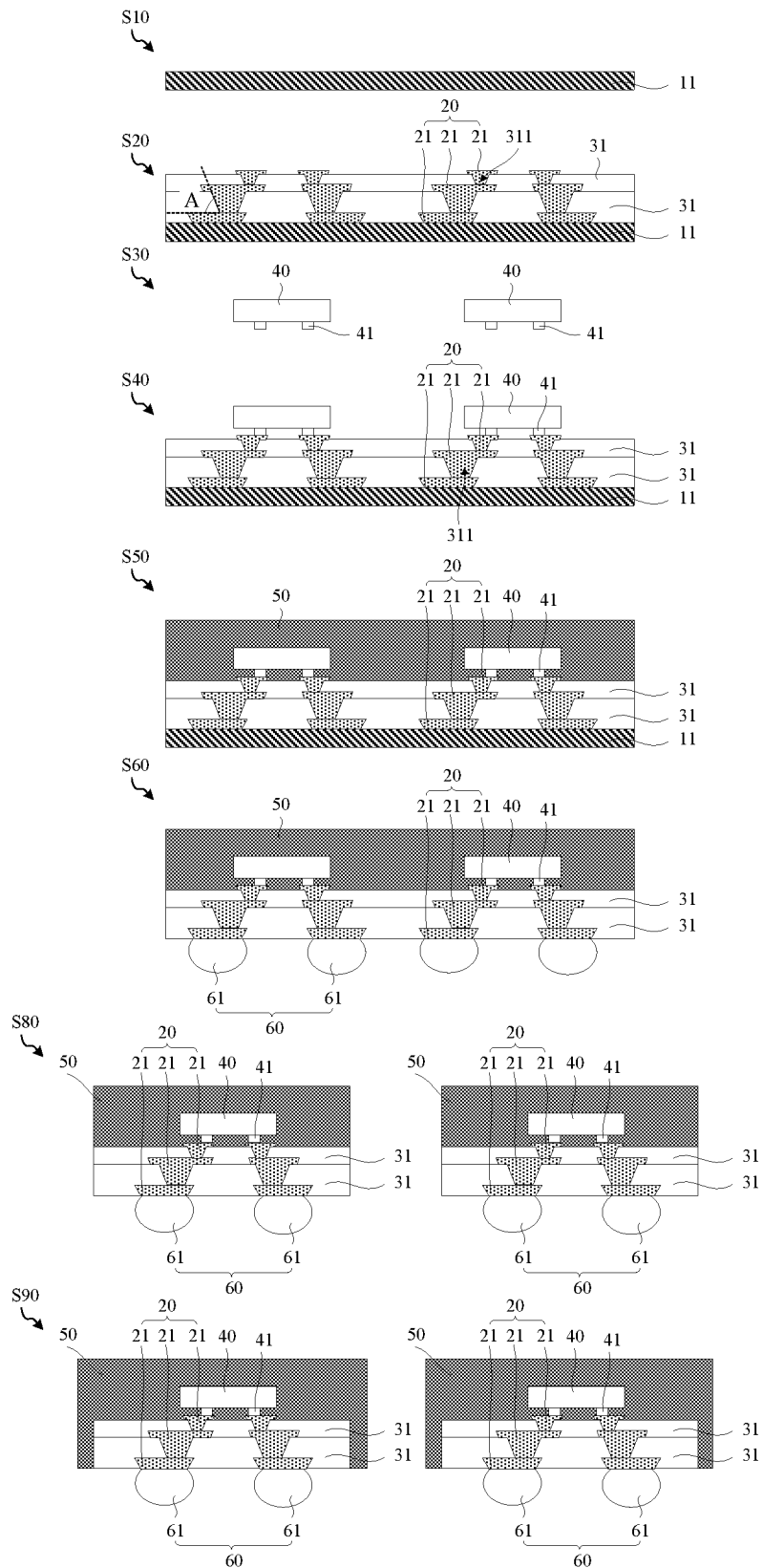
FIG. 12 illustrates schematic diagrams of semiconductor structures formed in various stages in another exemplary method of forming a semiconductor package consistent with disclosed embodiments of the present disclosure.

FIG. 12 illustrates schematic diagrams of semiconductor structures formed in various stages in another method of forming a semiconductor package consistent with disclosed embodiments of the present disclosure. In one embodiment, referring to FIG. 12, the method of forming the semiconductor package may include following steps.

In S10: providing the first substrate 11.

In S20: forming at least two first wiring layers 21 on a side of the first substrate 11.

In S30: providing a plurality of semiconductor elements 40, where each semiconductor element 40 may include a plurality of pins 41.

In S40: disposing the plurality of pins 41 of the each semiconductor element 40 on a side of the wiring structure 20 away from the first substrate 11.

In S50: forming an encapsulation structure 50 to encapsulate the at least one semiconductor element 40.

In S60: placing balls on the side of the wiring structure 20 away from the at least one semiconductor element 40.

In S80: cutting the first wiring layer 21 and the encapsulation structure 50 to form a plurality of semiconductor packages.

In S90: encapsulating the side edge of the first wiring layer.

In one embodiment, the encapsulation structure for encapsulating the side edge of the first wiring layer in S90 may be made of a same material and formed by a same process as the encapsulation structure 50 formed in S50. Therefore, the encapsulation layers formed in S90 and S50 may be regarded as an entity. In the disclosed embodiments of the present disclosure, the encapsulating area of the encapsulation structure 50 may increase by encapsulating the side edge, which may not only achieve the protection and heat dissipation of the semiconductor element 40, but also provide protection for the first wiring layer 21, thereby further improving the protection performance and heat dissipation performance of the semiconductor package.

Figure 13:
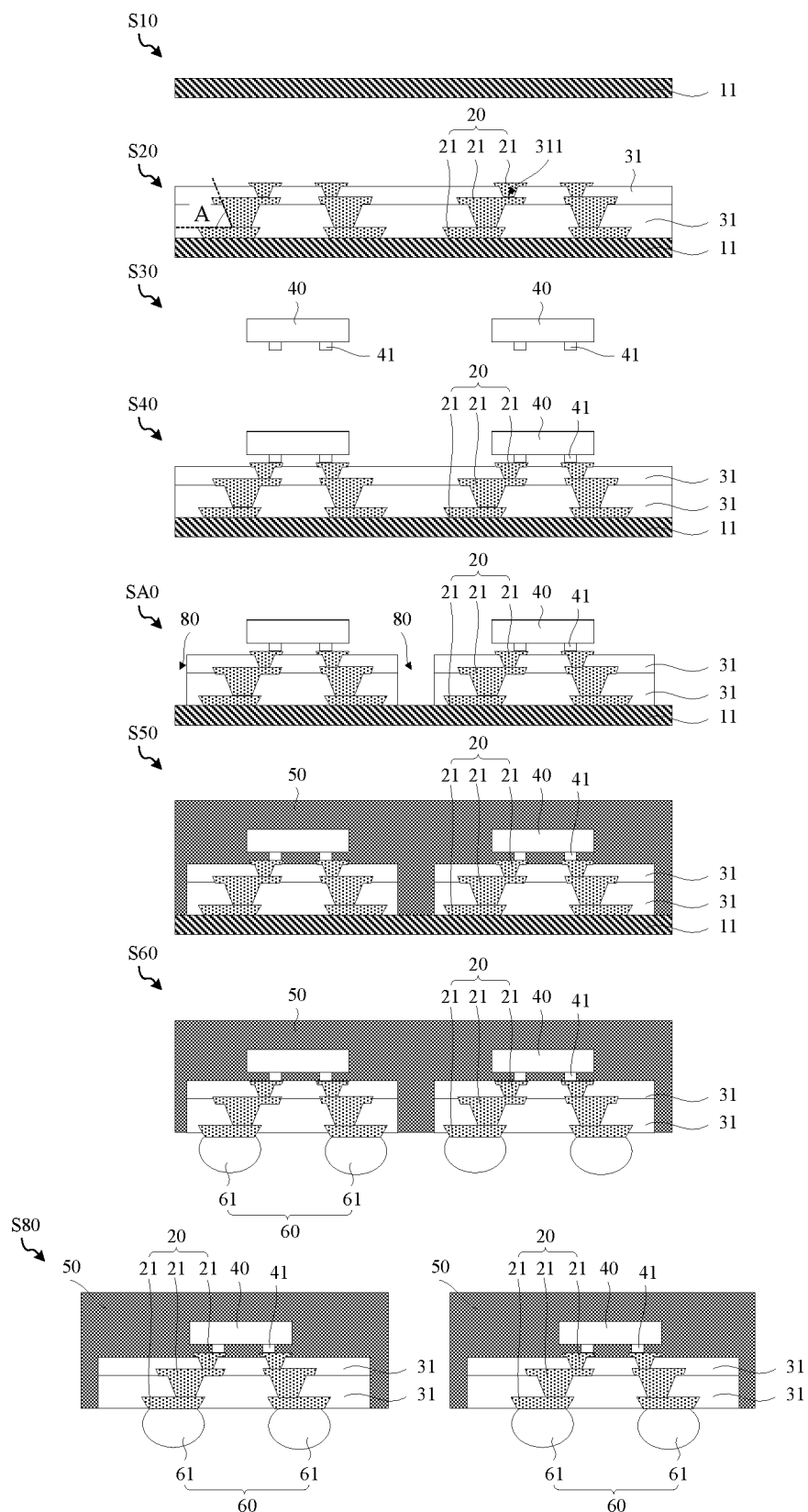
FIG. 13 illustrates schematic diagrams of semiconductor structures formed in various stages in another exemplary method of forming a semiconductor package consistent with disclosed embodiments of the present disclosure.

FIG. 13 illustrates schematic diagrams of semiconductor structures formed in various stages in another method of forming a semiconductor package consistent with disclosed embodiments of the present disclosure. In one embodiment, referring to FIG. 13, the method of forming the semiconductor package may include following steps.

In S10: providing the first substrate 11.

In S20: forming at least two first wiring layers 21 on a side of the first substrate 11.

In S30: providing a plurality of semiconductor elements 40, where each semiconductor element 40 may include a plurality of pins 41.

In S40: disposing the plurality of pins 41 of the each semiconductor element 40 on a side of the wiring structure 20 away from the first substrate 11.

In SA0: patterning an insulating layer in the wiring structure 20 to form a plurality of trenches 80 between adjacent two semiconductor elements 40.

In S50: forming an encapsulation structure 50 to encapsulate the at least one semiconductor element 40. The encapsulation structure 50 may be formed on the side of the wiring structure 20 away from the first substrate 11, on the side surface of the wiring structure 20, and around the semiconductor element 40 by filling the plurality of trenches 80 with an encapsulating material.

In S60: placing balls on the side of the wiring structure 20 away from the at least one semiconductor element 40.

In S80: cutting the first wiring layer 21 and the encapsulation structure 50 to form a plurality of semiconductor packages.

In the disclosed embodiments of the present disclosure, the plurality of trenches 80 may be formed in advance, and the encapsulating area of the encapsulation structure 50 may increase in the encapsulating process, which may not only achieve the protection and heat dissipation of the semiconductor element 40, but also provide protection for the first wiring layer 21, thereby further improving the protection performance and heat dissipation performance of the semiconductor package.

Figure 14:
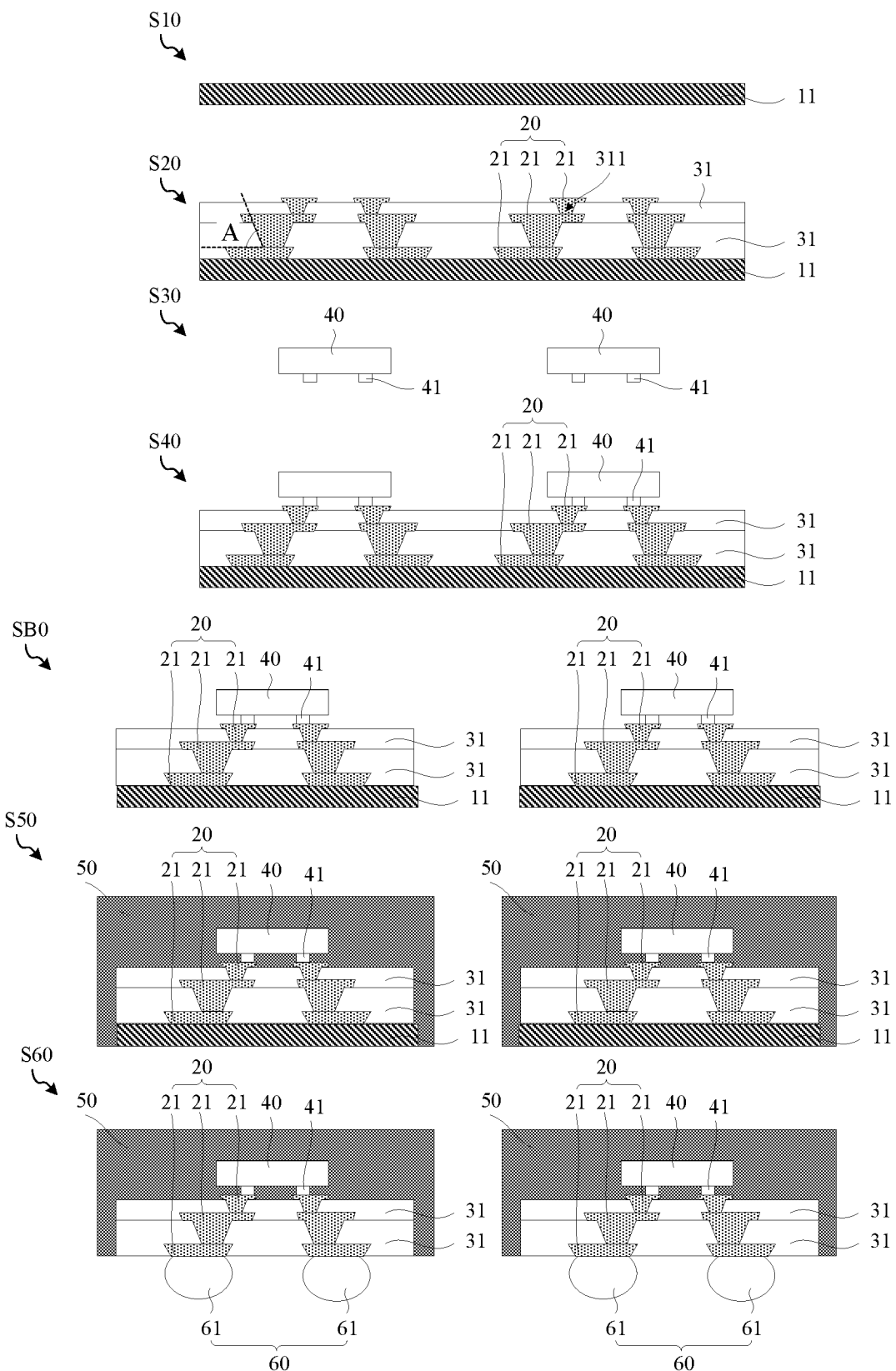
FIG. 14 illustrates schematic diagrams of semiconductor structures formed in various stages in another exemplary method of forming a semiconductor package consistent with disclosed embodiments of the present disclosure.

FIG. 14 illustrates schematic diagrams of semiconductor structures formed in various stages in another method of forming a semiconductor package consistent with disclosed embodiments of the present disclosure. In one embodiment, referring to FIG. 14, the method of forming the semiconductor package may include following steps.

In S10: providing the first substrate 11.

In S20: forming at least two first wiring layers 21 on a side of the first substrate 11.

In S30: providing a plurality of semiconductor elements 40, where each semiconductor element 40 may include a plurality of pins 41.

In S40: disposing the plurality of pins 41 of the each semiconductor element 40 on a side of the wiring structure 20 away from the first substrate 11.

In SB0: performing a cutting process. The first insulating layer 31 of the first wiring layer 21 may be cut.

In S50: forming an encapsulation structure 50 to encapsulate the at least one semiconductor element 40. The encapsulation structure 50 may be formed on the side of the wiring structure 20 away from the first substrate 11, on the side surface of the wiring structure 20, and around the semiconductor element 40.

In S60: placing balls on the side of the wiring structure 20 away from the at least one semiconductor element 40.

Compared with the methods of forming the semiconductor packages associated with FIG. 12 and FIG. 13, in the present embodiment associated with FIG. 14, the cutting process may be first performed, and then the encapsulating process may be performed. In other words, in the present embodiment, the encapsulating process may not need to be performed twice. The encapsulating of the semiconductor element 40 and the encapsulating of the side edge may be achieved by performing the encapsulating process once and without forming the plurality of trenches. Therefore, the present embodiment of the present disclosure may simplify the steps of the encapsulating process.

Figure 15:
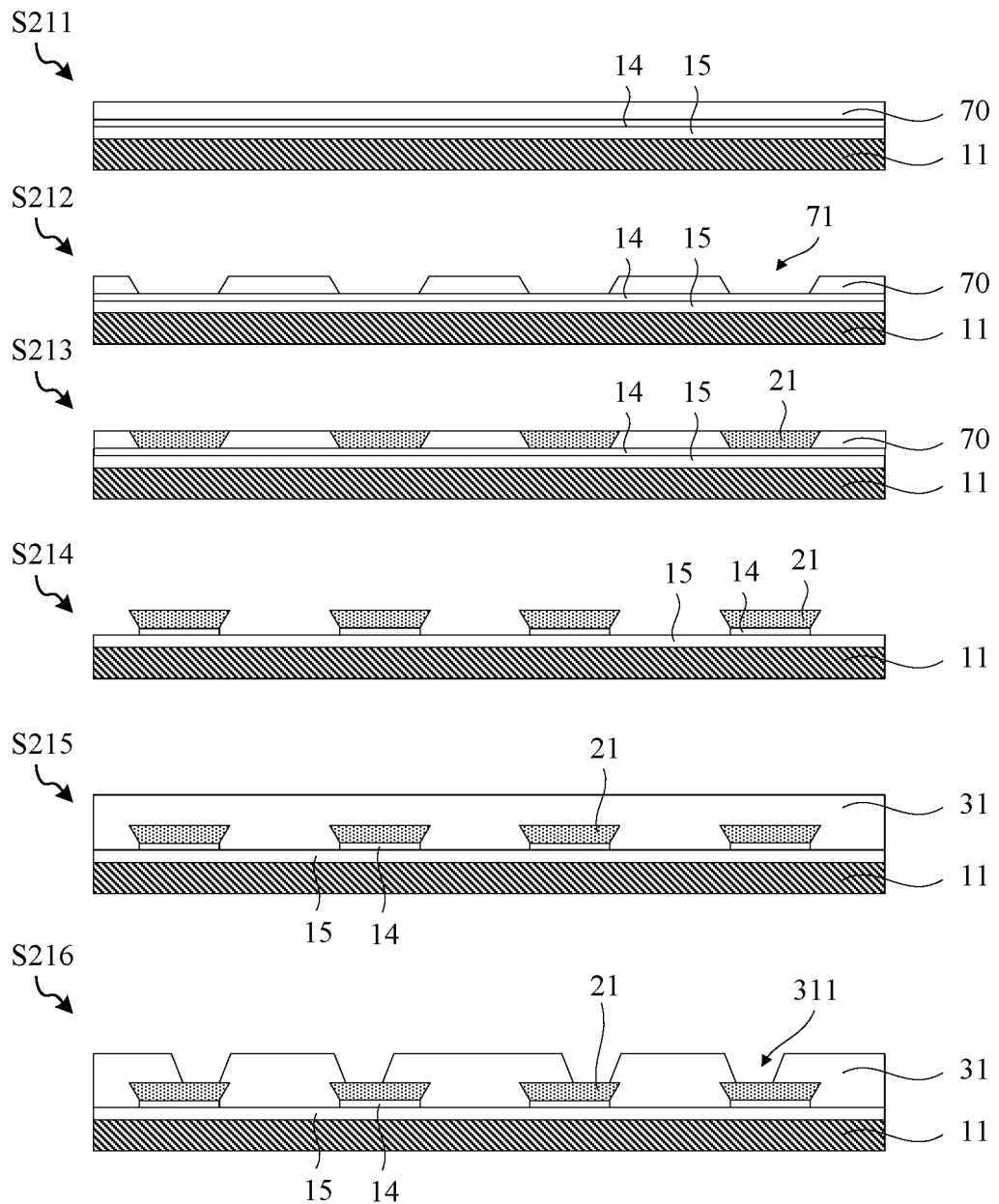
FIG. 15 illustrates schematic diagrams of semiconductor structures formed in various stages in an exemplary fabrication method of a first wiring layer consistent with disclosed embodiments of the present disclosure.

FIG. 15 illustrates schematic diagrams of semiconductor structures formed in various stages in a fabrication method of a first wiring layer consistent with disclosed embodiments of the present disclosure. In one embodiment, referring to FIG. 15, on the basis of the foregoing embodiments, the fabrication method of the first wiring layer 21 may include the following steps.

In S211: disposing a photoresist layer 70 over the first substrate 11. The photoresist layer 70 may be, e.g., photoresist. The material of the photoresist may be positive photoresist or negative photoresist. In one embodiment, the photoresist layer 70 may be formed on the first substrate using a coating process. Optionally, before disposing the photoresist layer 70, a seed layer 14 may be formed over the first substrate 11. In one embodiment, the seed layer 14 may be formed using a coating process. Optionally, before forming the seed layer 14, a fourth insulating layer 15 may be formed on the first substrate 11.

In S212: patterning the photoresist layer 70 to form a plurality of first openings 71. In one embodiment, the patterning process may be performed on the photoresist layer 70 using exposure and development processes to form the plurality of first openings 71. The first openings 71 may accommodate the first wiring layer 21 in a subsequent process. Therefore, the shape of the plurality of first openings 71 may define the shape of the first wiring layer 21.

In S213: forming a first wiring layer 21 in the plurality of first openings 71. The first wiring layer 21 may fill the plurality of first openings 71, and the first wiring layer 21 may be made of, e.g., copper or gold. In one embodiment, the first wiring layer 21 may be formed by filling the first opening 71 using an electroplating process. Optionally, in S211, before disposing the photoresist layer 70, the seed layer 14 may be formed on the first substrate 11. Then, the first wiring layer 21 formed in S213 may be in direct contact with the seed layer 14, such that the crystallization of the first wiring layer 21 may be uniform, which may facilitate to avoid abnormal growth of crystal grain of the first wiring layer 21 during the electroplating process, and may facilitate to improve the conductive performance of the first wiring layer 21.

In S214: removing the photoresist layer 70.

In S215: forming a first insulating layer 31 on the side of the first wiring layer 21 away from the first substrate 11. In one embodiment, the first insulating layer 31 may be made of a material including at least one of polyimide, liquid crystal polymer, acrylic and any other suitable insulating material. The first insulating layer 31 may have a desired insulating performance.

In S216: patterning the first insulating layer 31 to form a plurality of first through-holes 311. Each first through-hole 311 may expose the first wiring layer 21.

It can be seen from S211-S216 that, in the disclosed embodiments of the present disclosure, the first wiring layer 21 may be formed using a photolithography process and an electroplating process. The at least two first wiring layers 21 may be formed by repeating the above steps. The first wiring layer formed by the photolithography process and the electroplating process may have substantially high precision, and may be suitable for high-precision patterning. Optionally, before forming each first wiring layer 21, a seed layer 14 may be formed, such that the crystallization of the first wiring layer 21 may be uniform, which may facilitate to avoid abnormal growth of crystal grain of the first wiring layer 21 during the electroplating process, and may facilitate electrical connection between the at least two first wiring layers 21.

Figure 16:
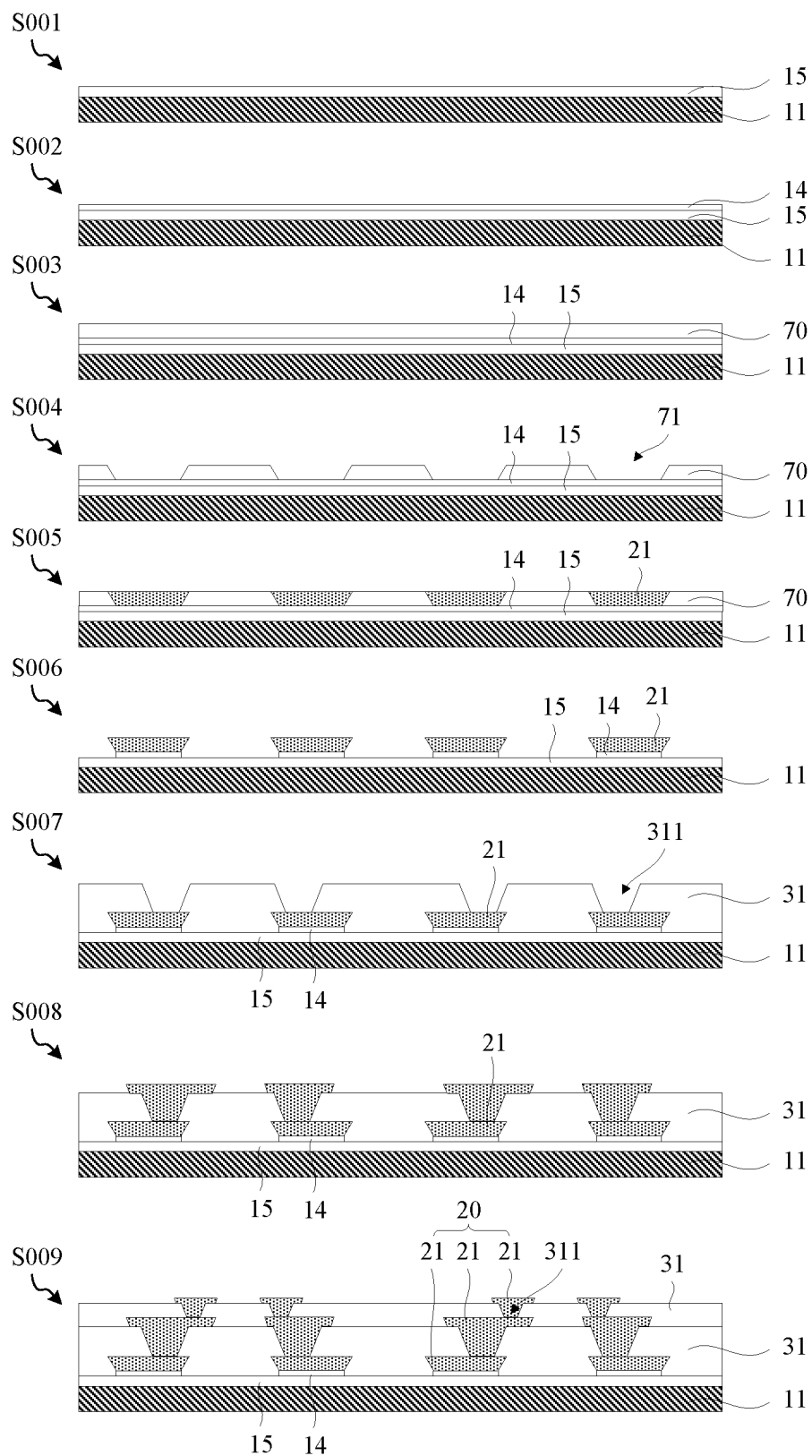
FIG. 16 illustrates schematic diagrams of semiconductor structures formed in S001-S008 in an exemplary method of forming a semiconductor package consistent with disclosed embodiments of the present disclosure.
Figure 17:
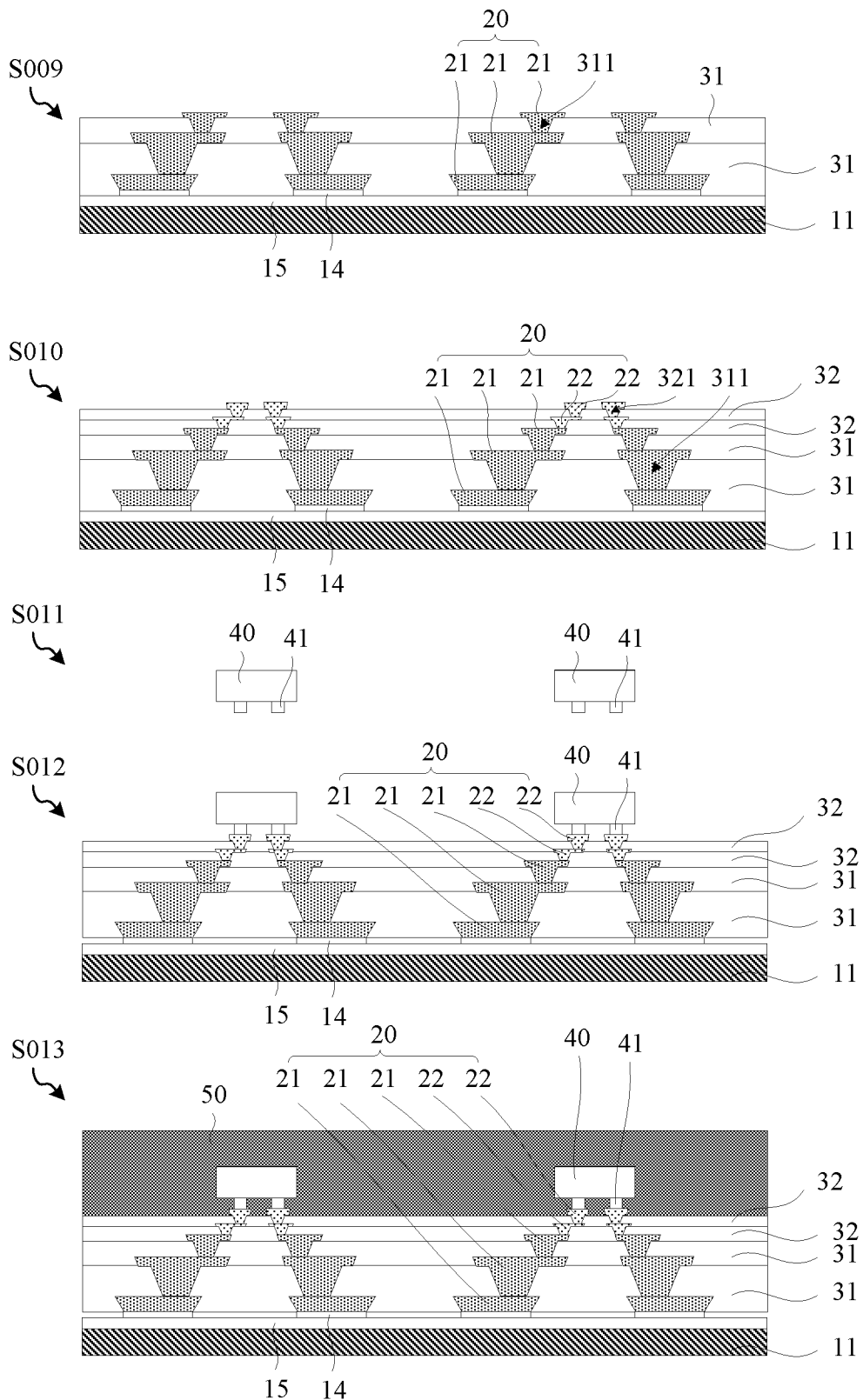
FIG. 17 illustrates schematic diagrams of semiconductor structures formed in S009-S013 in an exemplary method of forming a semiconductor package consistent with disclosed embodiments of the present disclosure.
Figure 18:
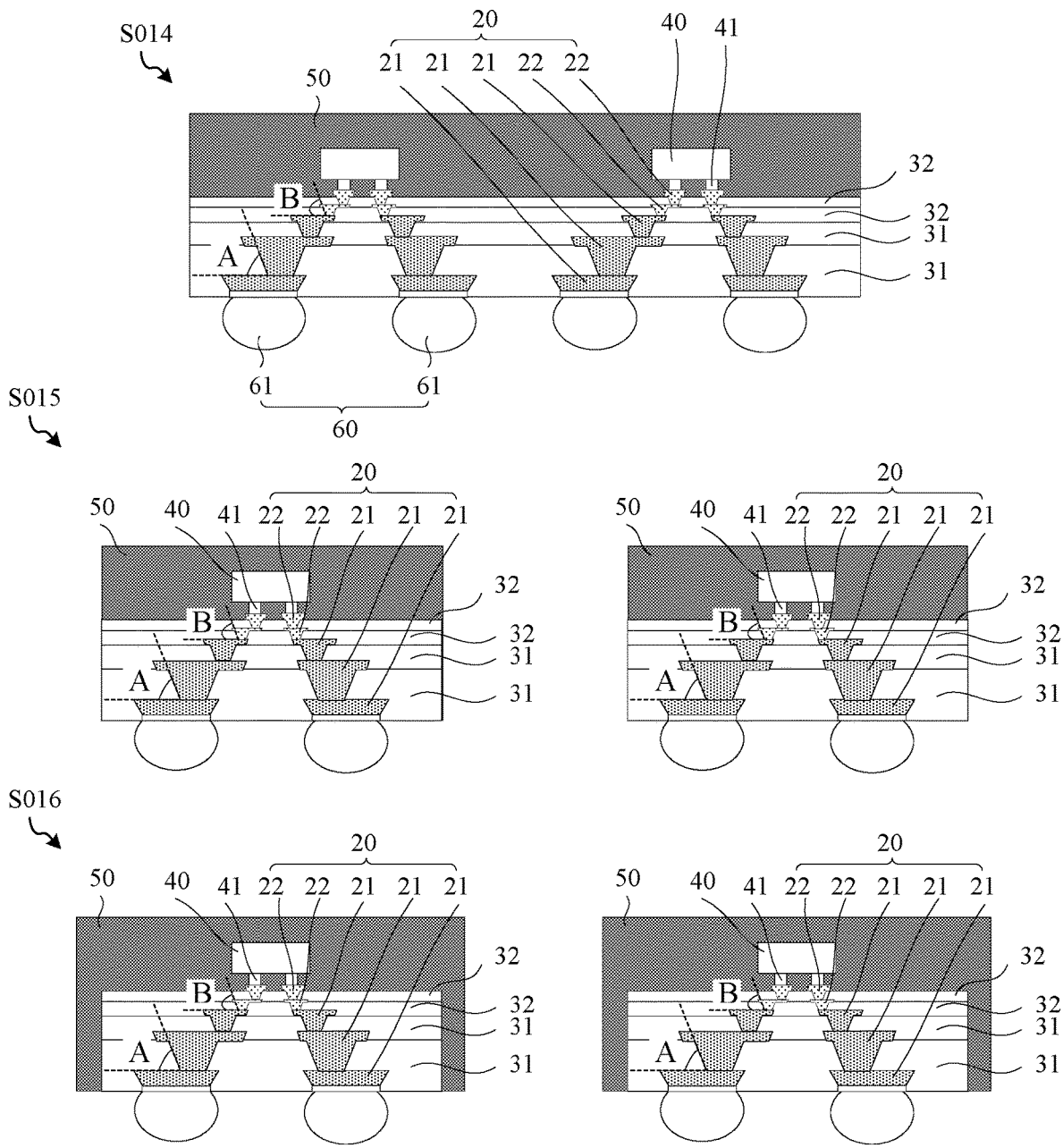
FIG. 18 illustrates schematic diagrams of semiconductor structures formed in S014-S016 in an exemplary method of forming a semiconductor package consistent with disclosed embodiments of the present disclosure.

FIG. 16 illustrates schematic diagrams of semiconductor structures formed in S001-S008 in a method of forming a semiconductor package consistent with disclosed embodiments of the present disclosure. FIG. 17 illustrates schematic diagrams of semiconductor structures formed in S009-S013 in a method of forming a semiconductor package consistent with disclosed embodiments of the present disclosure. FIG. 18 illustrates schematic diagrams of semiconductor structures formed in S014-S016 in a method of forming a semiconductor package consistent with disclosed embodiments of the present disclosure. In one embodiment, referring to FIGS. 16-18, on the basis of the foregoing embodiments, the method of forming the semiconductor package may include following steps.

In S001: providing a first substrate 11, and forming a fourth insulating layer 15 on the first substrate 11.

In S002: forming a seed layer 14 on the fourth insulating layer 15.

In S003: disposing a photoresist layer 70 over the first substrate 11.

In S004: patterning the photoresist layer 70 to form a plurality of first openings 71.

In S005: forming a first layer of the at least two first wiring layers 21 in the plurality of first openings 71.

In S006: removing the photoresist layer 70.

In S007: forming a first insulating layer 31 on a side of the first wiring layer 21 away from the first substrate 11, and patterning the first insulating layer 31 to form a plurality of first through-holes 311, where each first through-hole 311 may expose the first wiring layer 21.

In S008: repeating steps S004-S006 to form a second layer of the at least two first wiring layers 21 on the first layer of the at least two first wiring layers 21.

In S009: repeating steps S007-S008 to form a third layer of the at least two first wiring layers 21 on the second layer of the at least two first wiring layers 21.

In S010: forming two second wiring layers 22 on the side of the first wiring layer 21 away from the first substrate 11, where the wiring structure 20 of the semiconductor package may contain the at least two first wiring layers 21 and the at least two second wiring layers 22.

In S011: providing at least one semiconductor element 40, where each semiconductor element 40 may include a plurality of pins 41.

In S012: disposing the plurality of pins of the each semiconductor element 40 on a side of the wiring structure 20 away from the first substrate 11.

In S013: forming an encapsulation structure 50 to encapsulate the at least one semiconductor element 40.

In S014: placing balls on the side of the wiring structure 20 away from the at least one semiconductor element 40. Before placing the balls, the first substrate 11 may need to be peeled off to expose the seed layer 14, which may facilitate the electrical connection between the first solder ball 61 and the first wiring layer 21 with the lowest precision. In one embodiment, the first substrate 11 and the fourth insulating layer 15 together may be peeled off, such that the first solder ball 61 may be in direct contact with and electrically connected to the seed layer 14. In another embodiment, merely the first substrate 11 may be peeled off, and the first solder ball 61 formed by placing balls on the side of the fourth insulating layer away from the semiconductor element 40 may penetrate through the fourth insulating layer 15 and may be electrically connected to the first wiring layer 21.

In S015: cutting the first wiring layer 21 and the encapsulation structure 50.

In S016: encapsulating the side edge of the first wiring layer.

In can be seen from S001-S016 that the disclosed embodiments of the present disclosure may provide a specific method of forming a semiconductor package. The disclosed method may not only achieve low cost and high yield on the basis of achieving high precision, but also improve the alignment precision, and improve the protection performance and heat dissipation performance of semiconductor package.

Figure 19:
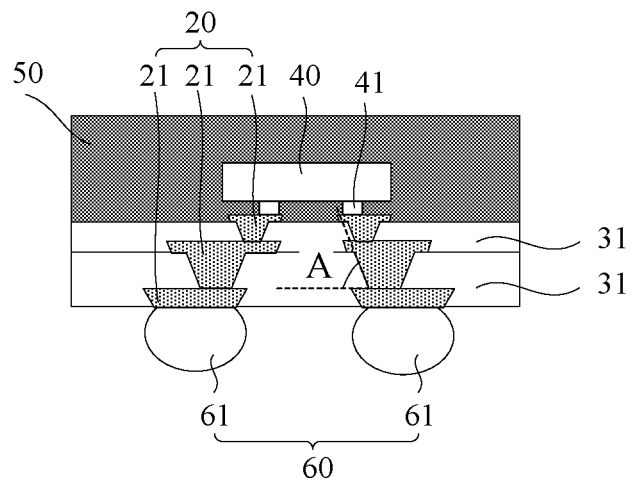
FIG. 19 illustrates a schematic structural diagram of an exemplary semiconductor package consistent with disclosed embodiments of the present disclosure.

The present disclosure further provides a semiconductor package. The semiconductor package may be formed by a method of forming a semiconductor package provided in any embodiment of the present disclosure. FIG. 19 illustrates a schematic structural diagram of a semiconductor package consistent with disclosed embodiments of the present disclosure. Referring to FIG. 19, the semiconductor package may include a semiconductor element 40, a wiring structure 20, an encapsulation structure 50 and a solder ball 61. The semiconductor element 40 may include a plurality of pins 41. One side of the wiring structure 20 may be electrically connected to the plurality of pins 41 of the semiconductor element 40. The wiring structure 20 may include at least two first wiring layers 21. A first insulating layer 31 may be disposed between adjacent two first wiring layers 21. The first insulating layer 31 may include a plurality of first through-holes 311, and the adjacent two first wiring layers 21 may be electrically connected to each other through the plurality of first through-holes 311. A diameter of one end of a first through-hole 311 close to the semiconductor element 40 may be greater than a diameter of another end of the first through-hole 311 away from the semiconductor element 40. The encapsulation structure 50 may at least partially surround the semiconductor element 40. The solder ball 61 may be located on a side of the wiring structure 20 away from the semiconductor element 40, and may be electrically connected to the first wiring layer 21.

A first wiring layer 21 closest to the semiconductor element 40 may be configured to have the largest line width and the lowest precision, and another first wiring layer 21 farther away from the semiconductor element 40 may have smaller line width and higher precision. Such arrangement may facilitate the precision of the first wiring layer 21 to be matched with the precision of the semiconductor element 40.

A diameter of one end of the first through-hole 311 close to the semiconductor element 40 being greater than a diameter of another end of the first through-hole 311 away from the semiconductor element 40 may refer to that the angle A between the outer surface of the formed first through-hole 311 and the first wiring layer 21 is less than 90°. Optionally, the first wiring layer 21 may be formed using a photolithography process and a copper plating process. Due to the characteristics of the photolithography process, such shape structure of the first through-hole 311 may be formed. Along a direction away from the first substrate 11, when wiring layers have a from-low-to-high precision and have angle A of less than 90°, the wiring layers may be defined as negative wiring layers. The at least two first wiring layers 21 may be negative wiring layers. For illustrative purposes, the number of first wiring layers 21 illustrated in FIG. 19 may be three. The number of first wiring layers 21 may be two, four, five or more, which may be determined according to the size of the semiconductor package, the size and process precision of the semiconductor element 40 in practical applications.

Optionally, the minimum line width of the first wiring layer 21 may be greater than or equal to 5 µm, 4 µm, 3 µm, 2 µm, 1 µm, 0.5 µm, or any other size. In one embodiment, the existing panel-level process may reach a line width of 5 µm. Therefore, the first wiring layer 21 having a minimum line width of 5 µm may be formed using a panel-level process. Compared with the wafer-level process, the cost may be reduced.

The semiconductor element 40 may refer to a die made from a wafer using a wafer-level process. The plurality of pins 41 may be used for electrical connection with the wiring layer. For illustrative purposes, the number of pins 41 illustrated in FIG. 19 may be two. The number of pins 41 may also be 4, 5, 10, 16, 32 or more.

The encapsulation structure 50 may be made of a material including epoxy resin molding compound (EMC). For illustrative purposes, the encapsulation structure 50 may be formed using an injection molding process. Optionally, the encapsulation structure 50 may cover the semiconductor element 40 to protect the semiconductor element 40, and may provide a heat dissipation path for the semiconductor element 40.

The solder ball 61 may be in contact with and electrically connected to the first wiring layer 21. The solder ball 61 may be used to achieve electrical connection between the plurality of pins 41 of the semiconductor element 40 and an external circuit. In one embodiment, the first solder ball 61 may be made of a metal material including tin, lead, copper, silver, gold, or an alloy thereof, etc.

As such, the disclosed methods for forming the semiconductor package, along with the formed semiconductor package according to various embodiments of the present disclosure may achieve the beneficial effects of high precision with low cost and high yield.

Optionally, the size of the semiconductor package may be greater than or equal to 40 mm×40 mm. Compared with the process of forming the first wiring layer 21 and the encapsulation structure 50 on the wafer in the existing technology, in the disclosed embodiments of the present disclosure, the diced semiconductor element 40 may be disposed on the already formed first wiring layer 21. In other words, the first wiring layer 21 may not need to occupy the area of the wafer, which may greatly improve the utilization rate of the wafer, thereby reducing material cost.

Figure 20:
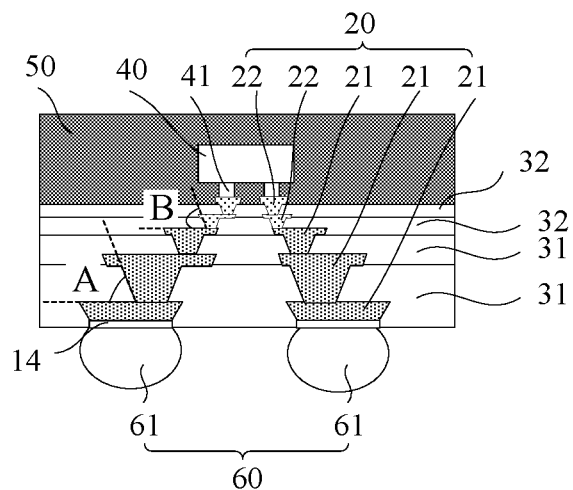
FIG. 20 illustrates a schematic structural diagram of another exemplary semiconductor package consistent with disclosed embodiments of the present disclosure.

FIG. 20 illustrates a schematic structural diagram of another semiconductor package consistent with disclosed embodiments of the present disclosure. Referring to FIG. 20, the semiconductor package may further include at least two second wiring layers 22 disposed between the first wiring layer 21 and the semiconductor element 40. A second insulating layer 32 may be disposed between adjacent two second wiring layers 22. The second insulating layer 32 may include a plurality of second through-holes 321, and the adjacent two second wiring layers 22 may be electrically connected to each other through the plurality of second through-holes 321. A side of the second wiring layer 22 away from the first wiring layer 21 may be electrically connected to the plurality of pins 41 of the semiconductor element 40.

The second wiring layer 22 may be similar to the first wiring layer 21, and the second insulating layer 32 may be disposed between adjacent two second wiring layers 22. The second insulating layer 32 may be patterned to form a plurality of second through-holes 321. The adjacent two second wiring layers 22 may be electrically connected to each other through the plurality of second through-holes 321. The wiring structure 20 of the semiconductor package may contain the first wiring layer 21 and the second wiring layer 22. For illustrative purposes, the number of second wiring layers 22 illustrated in FIG. 20 may be two. The number of second wiring layers 22 may be three, four, five or more, which may be determined according to the size of the semiconductor package, the size and process precision of the semiconductor element 40 in practical applications.

The difference between the second wiring layer 22 and the first wiring layer 21 may include that the minimum line width of the second wiring layer 22 is different from the minimum line width of the first wiring layer 21. In one embodiment, the minimum line width of the first wiring layer 21 may be greater than the minimum line width of the second wiring layer 22. The second wiring layer 22 may be a high-precision wiring layer, and the minimum line width of the second wiring layer 22 may be, e.g., less than 5 μm, 4 μm, 3 μm, 2 μm, 1 μm, 0.5 μm or less. Correspondingly, the first wiring layer 21 may be a low-precision wiring layer, and the minimum line width of the first wiring layer 21 may be, e.g., greater than or equal to 5 μm, 4 μm, 3 μm, 2 μm, 1 μm, 0.5 μm, or any other suitable size. In one embodiment, the existing panel-level process may reach a line width of 5 μm. Therefore, the first wiring layer 21 having a minimum line width of 5 μm may be formed using a panel-level process. Compared with the wafer-level process, the cost may be reduced. In one embodiment, the second wiring layer 22 may be formed using a wafer-level process to meet the requirements of high precision. The second wiring layer 22 may also be formed using a high-precision panel-level process, which may not be limited by the present disclosure.

In the disclosed embodiments of the present disclosure, the second wiring layer 22 may be disposed in the wiring structure 20, and the precision of the second wiring layer 22 may be higher than the precision of the first wiring layer 21, which may facilitate to match the precision of the first wiring layer 21 with the precision of the semiconductor element 40. In addition, in the disclosed embodiments of the present disclosure, the first wiring layer 21 may be formed using a panel-level process, the second wiring layer 22 may be formed using a wafer-level process, and ultimately the second wiring layer 22 may be configured to be electrically connected to the semiconductor element 40. Therefore, the high precision of the wafer-level process and the low cost of panel-level process may be combined, and advantages of the wafer-level process and the panel-level process may be combined to achieve the fabrication of the semiconductor package, which may not only facilitate to improve the high precision of the semiconductor package, but also facilitate to reduce the cost of the semiconductor package.

It should be noted that, in the above embodiments, the encapsulation structure 50 may cover the side of the wiring structure 20 away from the solder ball 61 and may be around the semiconductor element 40, which is not limited by the present disclosure. In certain embodiments, the encapsulation structure 50 may also be configured in any other form.

Figure 21:
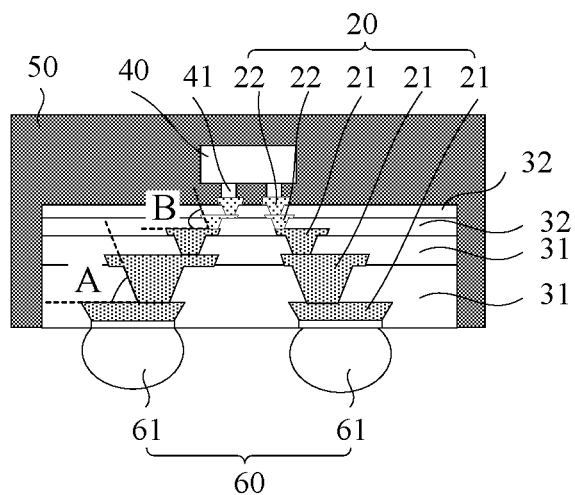
FIG. 21 illustrates a schematic structural diagram of another exemplary semiconductor package consistent with disclosed embodiments of the present disclosure.

FIG. 21 illustrates a schematic structural diagram of another semiconductor package consistent with disclosed embodiments of the present disclosure. In one embodiment, referring to FIG. 21, the encapsulation structure 50 may cover the side of the wiring structure 20 away from the solder ball 61, the side surface of the wiring structure 20 and the semiconductor element 40. In the disclosed embodiments of the present disclosure, the encapsulating area of the encapsulation structure 50 may increase, which may not only achieve the protection and heat dissipation of the semiconductor element 40, but also protect the first wiring layer 21, thereby further improving the protection performance and heat dissipation performance of the semiconductor package.

In one embodiment, referring to FIG. 21, on the basis of the foregoing embodiments, a diameter of one end of the second through-hole 321 close to the semiconductor element 40 may be greater than a diameter of another end of the second through-hole 321 away from the semiconductor element 40. In other words, the angle B between the outer surface of the formed second through-hole 321 and the first wiring layer 21 may be less than 90°. As can be seen from the definition of the negative wiring layer, the second wiring layer 22 may be a negative wiring layer.

The wiring structure 20 of the semiconductor package provided by the disclosed embodiments of the present disclosure may be a structure containing a negative low-precision wiring layer and a negative high-precision wiring layer. In the disclosed embodiments of the present disclosure, the second wiring layer 22 may be formed using a high-precision panel-level process. In other words, both the first wiring layer 21 and the second wiring layer 22 may be formed using a panel-level process, thereby facilitating to further reduce the manufacturing cost of the semiconductor package.

Figure 22:
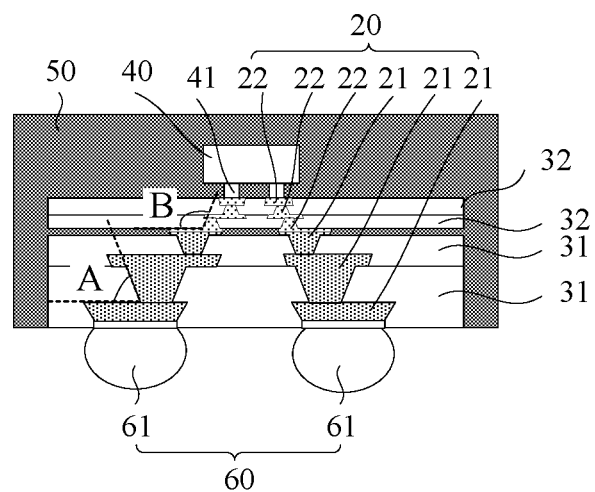
FIG. 22 illustrates a schematic structural diagram of another exemplary semiconductor package consistent with disclosed embodiments of the present disclosure.

FIG. 22 illustrates a schematic structural diagram of another semiconductor package consistent with disclosed embodiments of the present disclosure. In one embodiment, referring to FIG. 22, a diameter of one end of the second through-hole 321 close to the semiconductor element 40 may be smaller than a diameter of another end of the second through-hole 321 away from the semiconductor element 40. In other words, the angle B between the outer surface of the formed second through-hole 321 and the first wiring layer 21 may be greater than 90°. Along a direction away from the first substrate 11, when wiring layers have a from-low-to-high precision and have angle A of greater than 90°, the wiring layers may be defined as positive wiring layers. Then, the at least two second wiring layers 22 may be positive wiring layers.

The wiring structure 20 of the semiconductor package provided by the disclosed embodiments of the present disclosure may be a structure containing a negative low-precision wiring layer and a positive high-precision wiring layer. In the disclosed embodiments of the present disclosure, the first wiring layer 21 may be formed using a panel-level process, the second wiring layer 22 may be formed using a wafer-level process, and ultimately the second wiring layer 22 may be configured to be electrically connected to the semiconductor element 40. Therefore, the high precision of wafer-level process and the low cost of panel-level process may be combined, and advantages of the wafer-level process and the panel-level process may be combined to achieve the fabrication of the semiconductor package, which may not only facilitate to improve the high precision of the semiconductor package, but also facilitate to reduce the cost of the semiconductor package.

Figure 23:
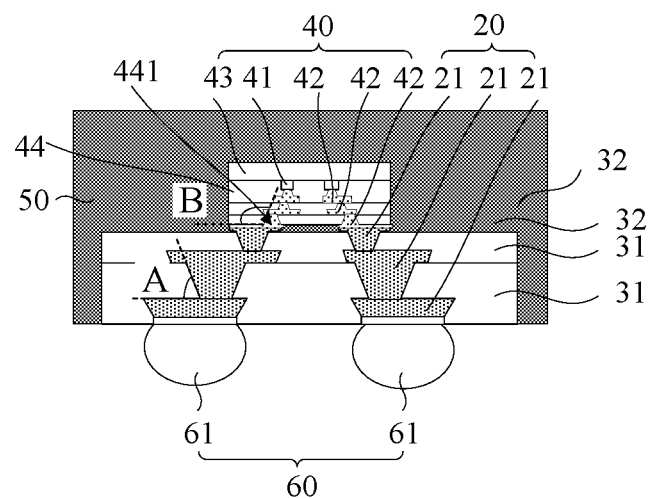
FIG. 23 illustrates a schematic structural diagram of another exemplary semiconductor package consistent with disclosed embodiments of the present disclosure.

FIG. 23 illustrates a schematic structural diagram of another semiconductor package consistent with disclosed embodiments of the present disclosure. In one embodiment, referring to FIG. 23, the semiconductor element 40 may further include a die 43 and at least two third wiring layers 42. The third wiring layer 42 may be located on a side of the die 43 close to the wiring structure 20, and a third wiring layer 42 farthest away from the die 43 may be configured as the pin 41 of the semiconductor element 40. A third insulating layer 44 may be disposed between adjacent two third wiring layers 42. The third insulating layer 44 may include a plurality of third through-holes 441, and the adjacent two third wiring layers 42 may be electrically connected to each other through the plurality of third through-holes 441.

In the disclosed embodiments of the present disclosure, the third wiring layer 42 having the precision matched with the first wiring layer 21 may be disposed in the semiconductor element 40. The first wiring layer 21 may be formed under a panel-level process, the semiconductor element 40 may be formed under a wafer-level process, and ultimately the first wiring layer 21 may be configured to be electrically connected to the semiconductor element 40. Therefore, the high precision of the wafer-level process and the low cost of the panel-level process may be combined, and advantages of the wafer-level process and the panel-level process may be combined to achieve the fabrication of the semiconductor package, which may not only facilitate to improve the high precision of the semiconductor package, but also facilitate to reduce the cost of the semiconductor package.

In one embodiment, referring to FIG. 23, a diameter of one end of the third through-hole 441 close to the wiring structure 20 may be greater than a diameter of another end of the third through-hole 441 away from the wiring structure 20. In other words, the angle B between the outer surface of the formed third through-hole 441 and the first wiring layer 21 may be greater than 90°. As can be seen from the definition of the positive wiring layer, the third wiring layer 42 may be a positive wiring layer. Therefore, such formed wiring structure 20 of the semiconductor package may be a structure containing a negative low-precision wiring layer and the semiconductor element (a positive high-precision wiring layer).

Optionally, referring to FIGS. 20-23, on the basis of the above embodiments, the semiconductor package may further include a seed layer 14. The seed layer 14 may be located on the side of the first wiring layer 21 away from the semiconductor element 40, and the solder ball 61 may be electrically connected to the seed layer 14. In the disclosed embodiments of the present disclosure, the seed layer 14 may be disposed between the solder ball 61 and the first wiring layer 21, such that the crystallization of the first wiring layer 21 may be uniform, which may facilitate to avoid abnormal growth of crystal grain of the first wiring layer 21 during the electroplating process, and may facilitate the electrical connection between the first wiring layer 21 and the solder ball 61.

Optionally, on the basis of the above embodiments, the semiconductor package may further include a fourth insulating layer. The fourth insulating layer may be located on the side of the first wiring layer 21 away from the semiconductor element 40. The solder ball 61 may penetrate through the fourth insulating layer to be electrically connected to the first wiring layer 21.

The description of the disclosed embodiments is provided to illustrate the present disclosure to those skilled in the art.

Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A semiconductor package, comprising:
   a semiconductor element, including a plurality of pins;
   a wiring structure, wherein a side of the wiring structure is electrically connected to the plurality of pins of the semiconductor element, the wiring structure includes at least two first wiring layers, a first insulating layer is disposed between adjacent two first wiring layers of the at least two first wiring layers, the first insulating layer includes a plurality of first through-holes, the adjacent two first wiring layers are electrically connected to each other through the plurality of first through-holes, and a diameter of one end of a first through-hole of the plurality of first through-holes close to the semiconductor element is greater than a diameter of another end of the first through-hole of the plurality of first through-holes away from the semiconductor element;
   an encapsulation structure, at least partially surrounding the semiconductor element; and
   a solder ball, located on a side of the wiring structure away from the semiconductor element, wherein the solder ball is electrically connected to the at least two first wiring layers,
   wherein the wiring structure further includes at least two second wiring layers, disposed between the at least two first wiring layers and the semiconductor element, a second insulating layer is disposed between adjacent two second wiring layers of the at least two second wiring layers, the second insulating layer includes a plurality of second through-holes, and an angle between an outer surface of a second through-hole and the first wiring layers is greater than 90°.

2. The semiconductor package according to claim 1, wherein
   the adjacent two second wiring layers are electrically connected to each other through the plurality of second through-holes, and a side of the at least two second wiring layers away from the at least two first wiring layers is electrically connected to the plurality of pins of the semiconductor element.

3. The semiconductor package according to claim 2, wherein: a diameter of one end of a second through-hole of the plurality of second through-holes close to the semiconductor element is smaller than a diameter of another end of the second through-hole of the plurality of second through-holes away from the semiconductor element.

4. The semiconductor package according to claim 3, wherein an angle between an outer surface of a first through-hole and an underneath first wiring layer is less than 90°.

5. The semiconductor package according to claim 2, wherein a minimum line width of the first wiring layers is greater than a minimum line width of the second wiring layers.

6. The semiconductor package according to claim 2, wherein a material of the second wiring layers includes copper or gold.

7. The semiconductor package according to claim 1, wherein the semiconductor element further includes:

a die and at least two third wiring layers, wherein the at least two third wiring layers are located on a side of the die close to the wiring structure, a third wiring layer farthest away from the die is configured as the plurality of pins of the semiconductor element, a third insulating layer is disposed between adjacent two third wiring layers of the at least two third wiring layers, the third insulating layer includes a plurality of third through-holes, and the adjacent two third wiring layers are electrically connected to each other through the plurality of third through-holes.

8. The semiconductor package according to claim 7, wherein:
a diameter of one end of a third through-hole of the plurality of third through-holes close to the wiring structure is greater than a diameter of another end of the third through-hole of the plurality of third through-holes away from the wiring structure.

9. The semiconductor package according to claim 5, further including:
a seed layer, located on a side of the at least two first wiring layers away from the semiconductor element, wherein the solder ball is electrically connected to the seed layer.

10. The semiconductor package according to claim 5, further including:
a fourth insulating layer, located on a side of the at least two first wiring layers away from the semiconductor element, wherein the solder ball penetrates through the fourth insulating layer and is electrically connected to the at least two first wiring layers.

11. The semiconductor package according to claim 5, wherein an angle between an outer surface of the formed third through-hole and the third wiring layers is less than 90°.

12. The semiconductor package according to claim 7, wherein a line width of the third wiring layers gradually increases along a direction away from the die.

13. The semiconductor package according to claim 1, wherein:
the encapsulation structure covers the side of the wiring structure away from the solder ball, and is around the semiconductor element.

14. The semiconductor package according to claim 1, wherein:
the encapsulation structure covers the side of the wiring structure away from the solder ball and a side surface of the wiring structure, and is around the semiconductor element.

15. The semiconductor package according to claim 1, wherein a size of the semiconductor package is greater than or equal to 40 mm×40 mm.

16. The semiconductor package according to claim 1, wherein the semiconductor element further includes:
a die and at least two third wiring layers, wherein the at least two third wiring layers are located on a side of the die close to the wiring structure, and a third wiring layer farthest away from the die is configured as the plurality of pins of the semiconductor element.

17. The semiconductor package according to claim 1, wherein an angle between an outer surface of the formed first through-hole and the first wiring layers is less than 90°.

18. The semiconductor package according to claim 1, wherein the solder is made of a metal material, including tin, lead, copper, silver, gold, or an alloy thereof.

19. The semiconductor package according to claim 1, wherein a material of the first wiring layers includes copper or gold.

* * * * *